United States Patent [19]
Arimoto et al.

[11] Patent Number: 6,051,826
[45] Date of Patent: *Apr. 18, 2000

[54] PHOTOSENSOR WITH FILTER FOR CUTTING OFF THE INPUT OF INVISIBLE INFORMATION

[75] Inventors: Shinobu Arimoto, Yokohama; Kazuo Yoshinaga, Machida; Toshio Hayashi, Kawasaki; Takehiko Nakai, Tokyo; Tsutomu Utagawa, Yokohama; Tetsuya Nagase, Kawasaki; Nobuatsu Sasanuma, Yokohama, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/922,390

[22] Filed: Sep. 3, 1997

Related U.S. Application Data

[63] Continuation of application No. 08/139,173, Oct. 21, 1993, abandoned.

[30] Foreign Application Priority Data

| Oct. 23, 1992 | [JP] | Japan | 4-286346 |
| Oct. 23, 1992 | [JP] | Japan | 4-286347 |
| Oct. 23, 1992 | [JP] | Japan | 4-286377 |
| Oct. 23, 1992 | [JP] | Japan | 4-286378 |

[51] Int. Cl.$^7$ ............................................. H01J 40/14
[52] U.S. Cl. ........................ 250/208.1; 250/226; 358/518
[58] Field of Search ............................... 250/208.1, 556, 250/370.06, 370.08, 339.05, 226, 234; 355/201; 358/514, 500, 518; 356/71; 348/33, 29, 164, 166; 235/468, 469; 257/440

[56] References Cited

U.S. PATENT DOCUMENTS

| 4,587,434 | 5/1986 | Roes et al. ............................ 250/556 |
| 4,739,377 | 4/1988 | Allen ..................................... 355/133 |
| 5,107,333 | 4/1992 | Poque et al. .......................... 348/599 |
| 5,140,411 | 8/1992 | Haneda et al. ........................ 358/500 |
| 5,481,334 | 1/1996 | Arimoto et al. ....................... 250/556 |

FOREIGN PATENT DOCUMENTS

| 0412886   | 2/1991  | European Pat. Off. . |
| 0440169   | 8/1991  | European Pat. Off. . |
| 4011281   | 10/1990 | Germany . |
| 4011281A1 | 10/1990 | Germany . |
| 2207830   | 2/1989  | United Kingdom . |

*Primary Examiner*—Que T. Le
*Attorney, Agent, or Firm*—Fitzpatrick, Cella, Harper & Scinto

[57] ABSTRACT

Visible information of the document sheet and information other the visible information are efficiently read by an image sensing apparatus including a first line sensor for reading the visible information of the document sheet and a second line sensor for reading the information other than the visible information.

10 Claims, 36 Drawing Sheets

FIG. 3

| | IMAGE SCANNER | PRINTER | |
|---|---|---|---|
| FIRST SCAN | MODE 1<br>GENERAL POSITION OF FLUORESCENT MARK IS DETECTED | MAGENTA OUTPUT | |
| SECOND SCAN | MODE 2<br>FLUORESCENT MARK IS EXTRACTED/JUDGED | CYAN OUTPUT | |
| THIRD AND FOURTH SCAN | MODE 3<br>COUNTERFEIT PREVENTION PROC IS EXECUTED | YELLOW OUTPUT<br>BLACK OUTPUT | |

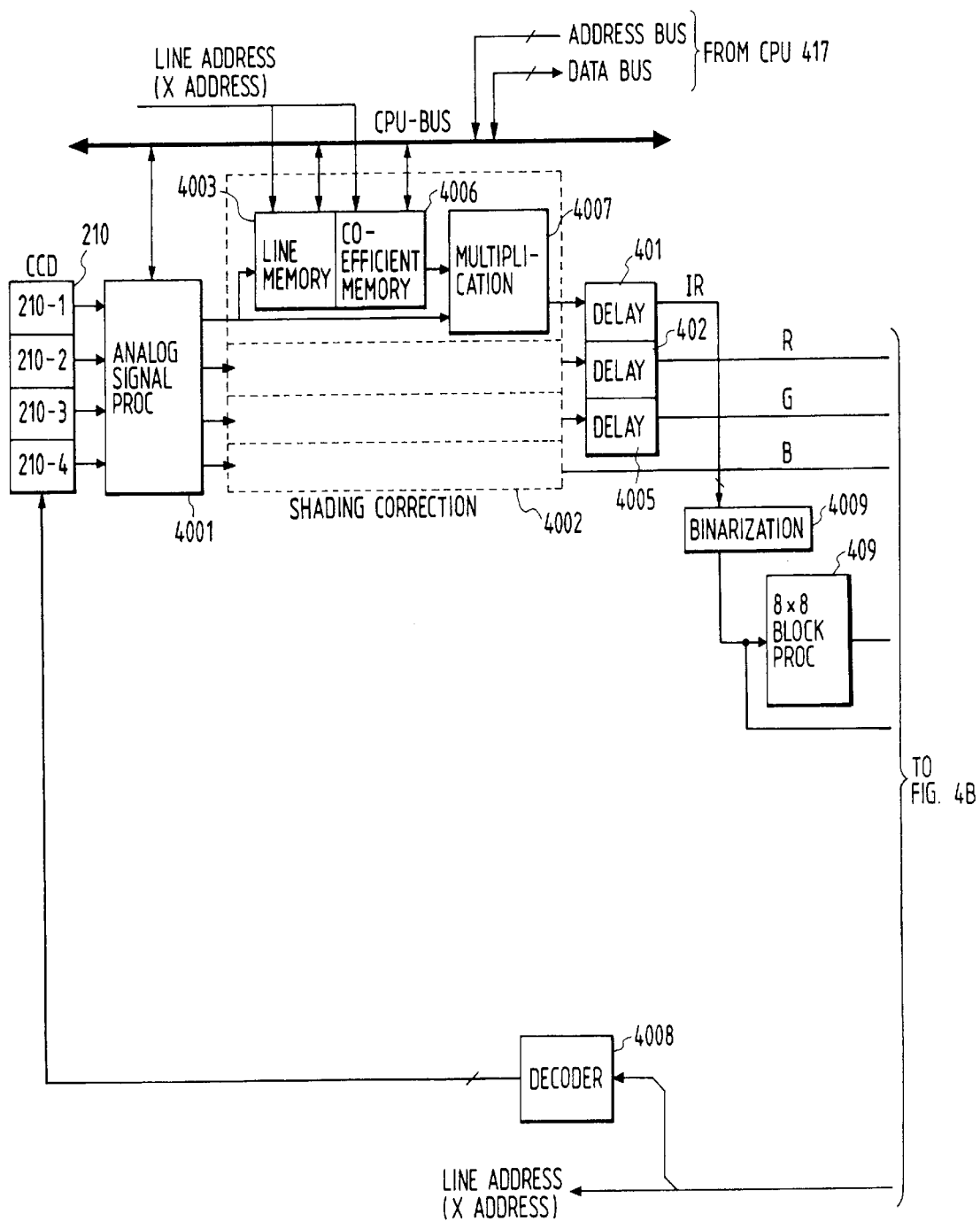

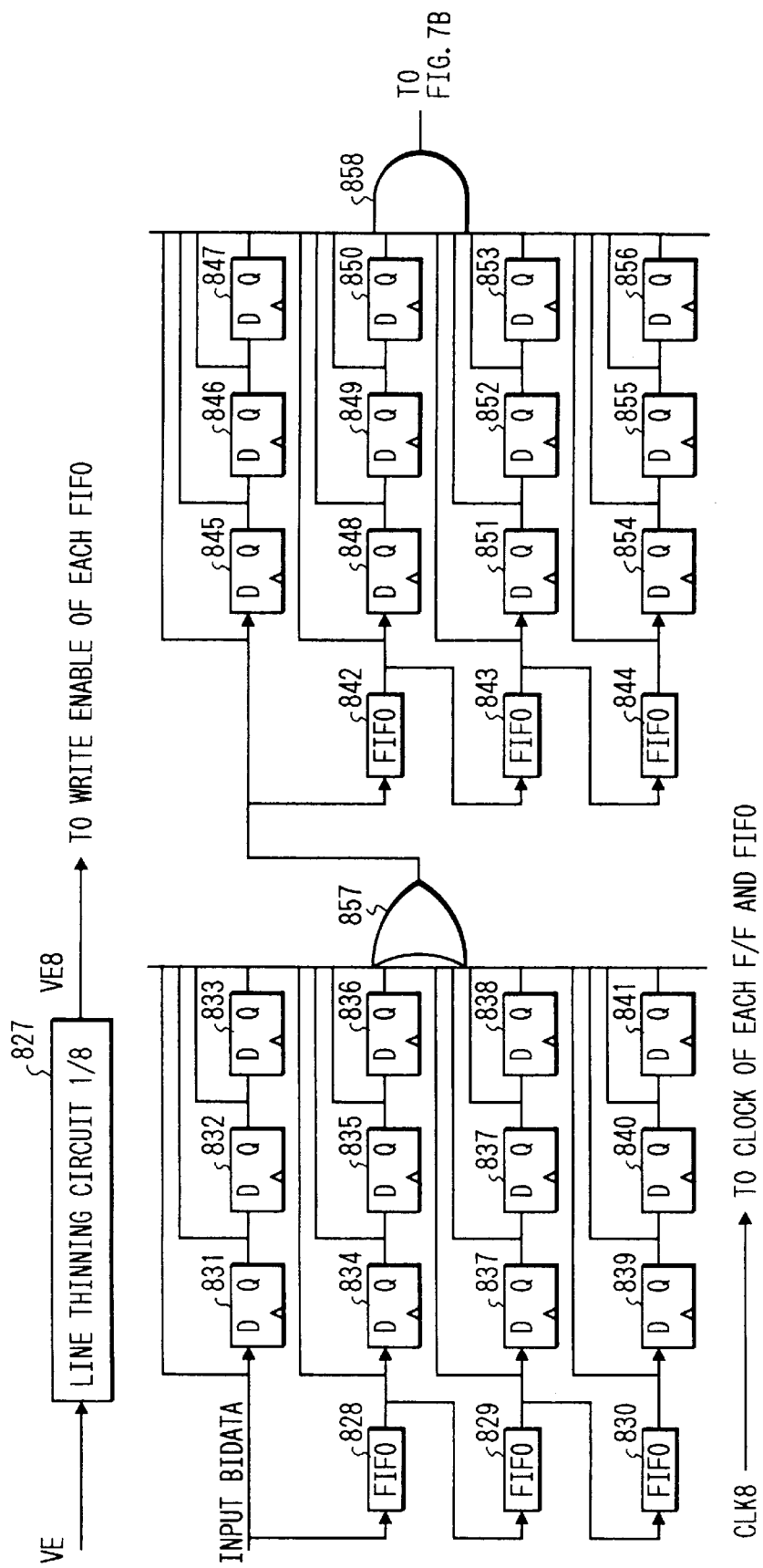

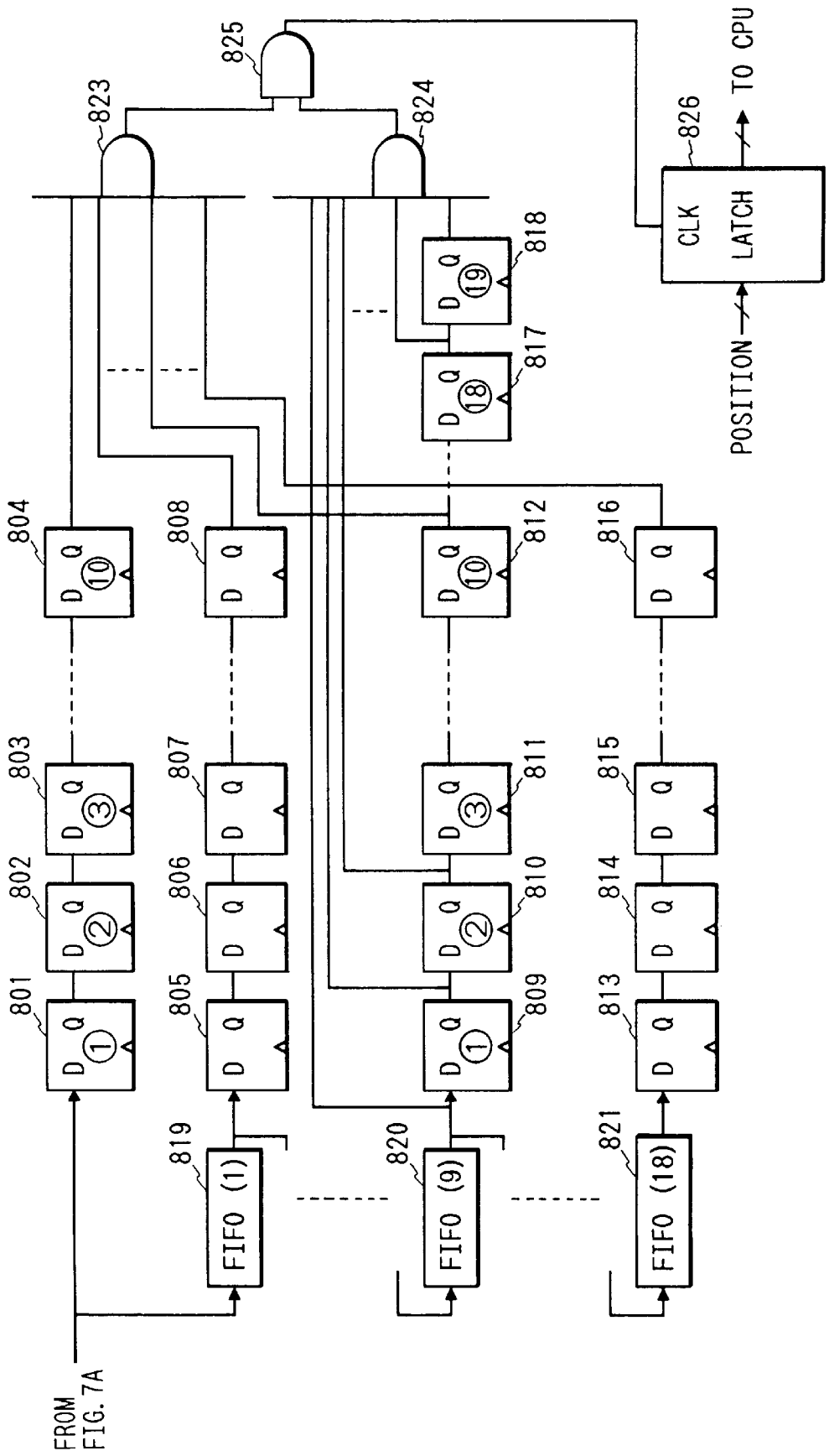

FIG. 11
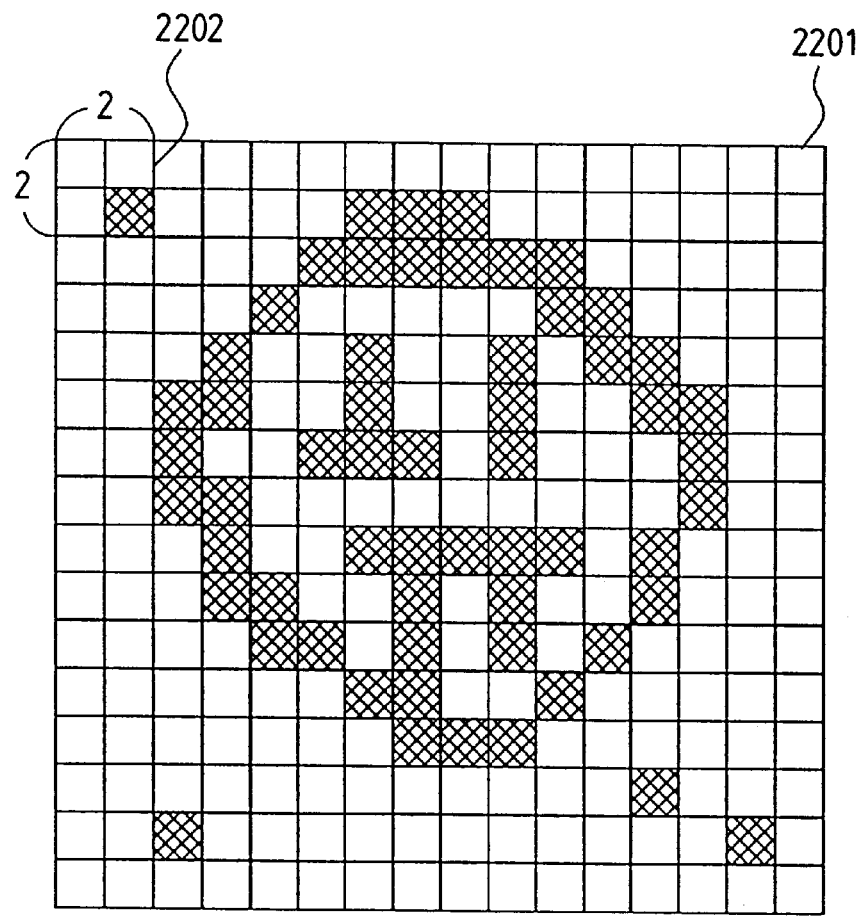
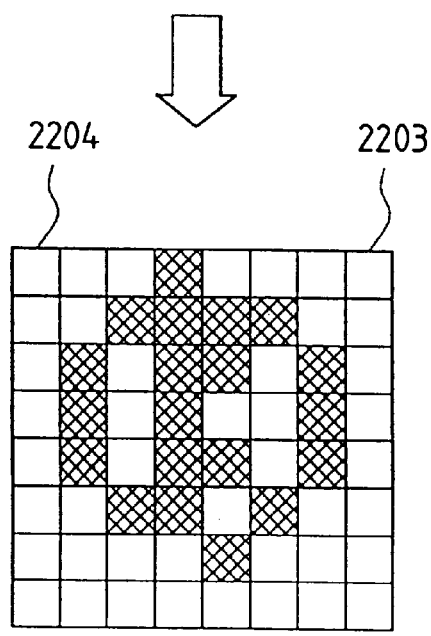

MAIN SCAN DIRECTION

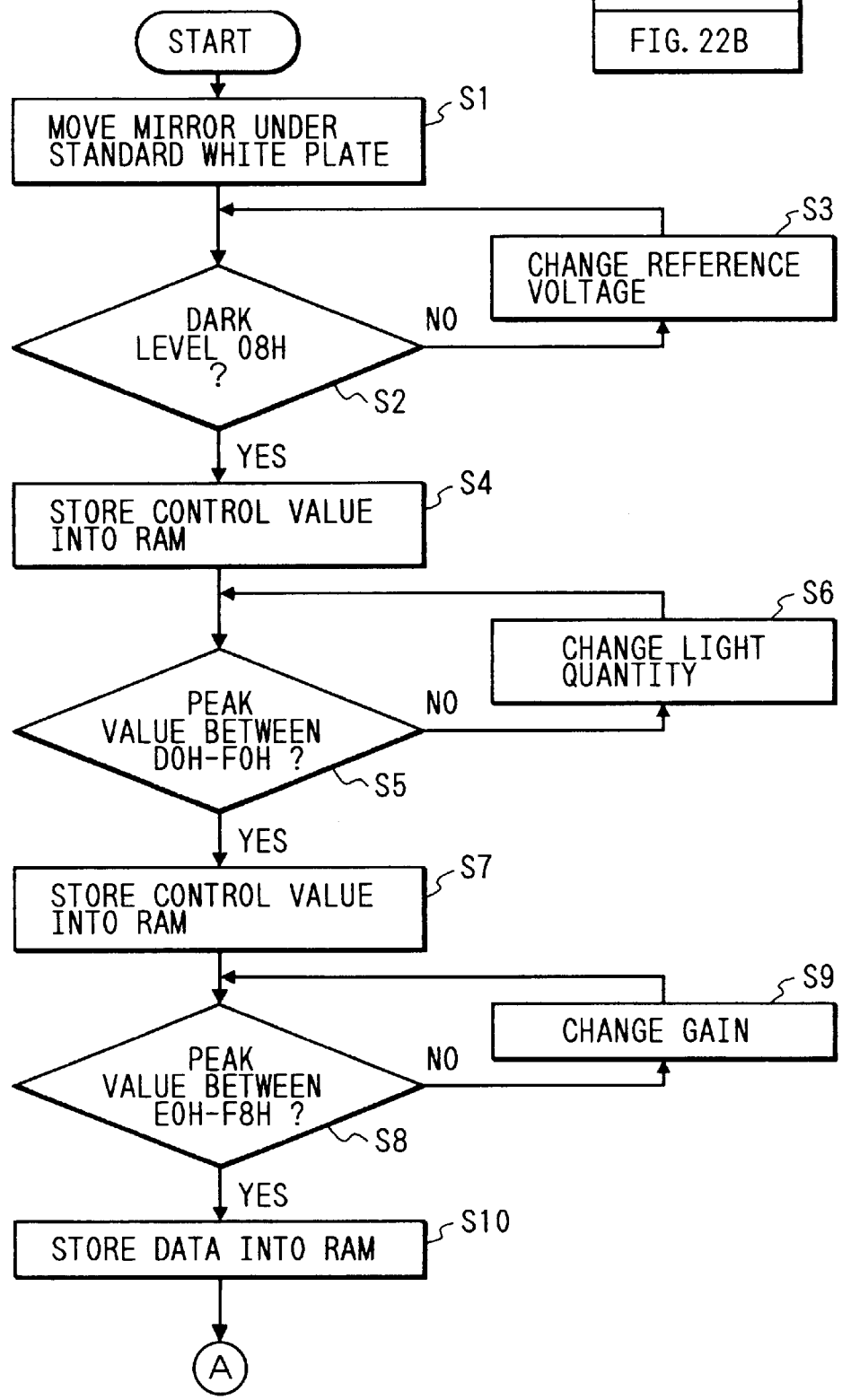

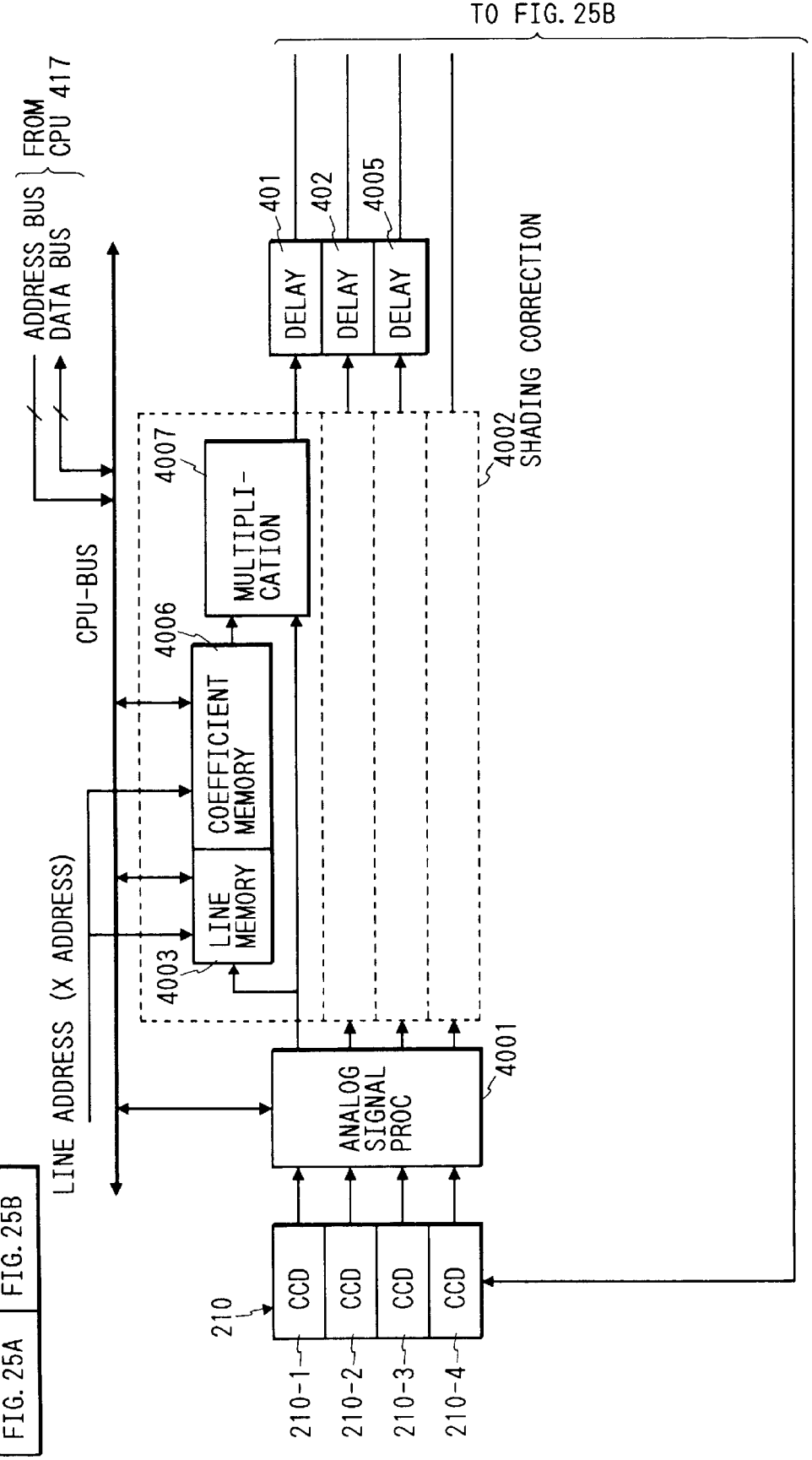

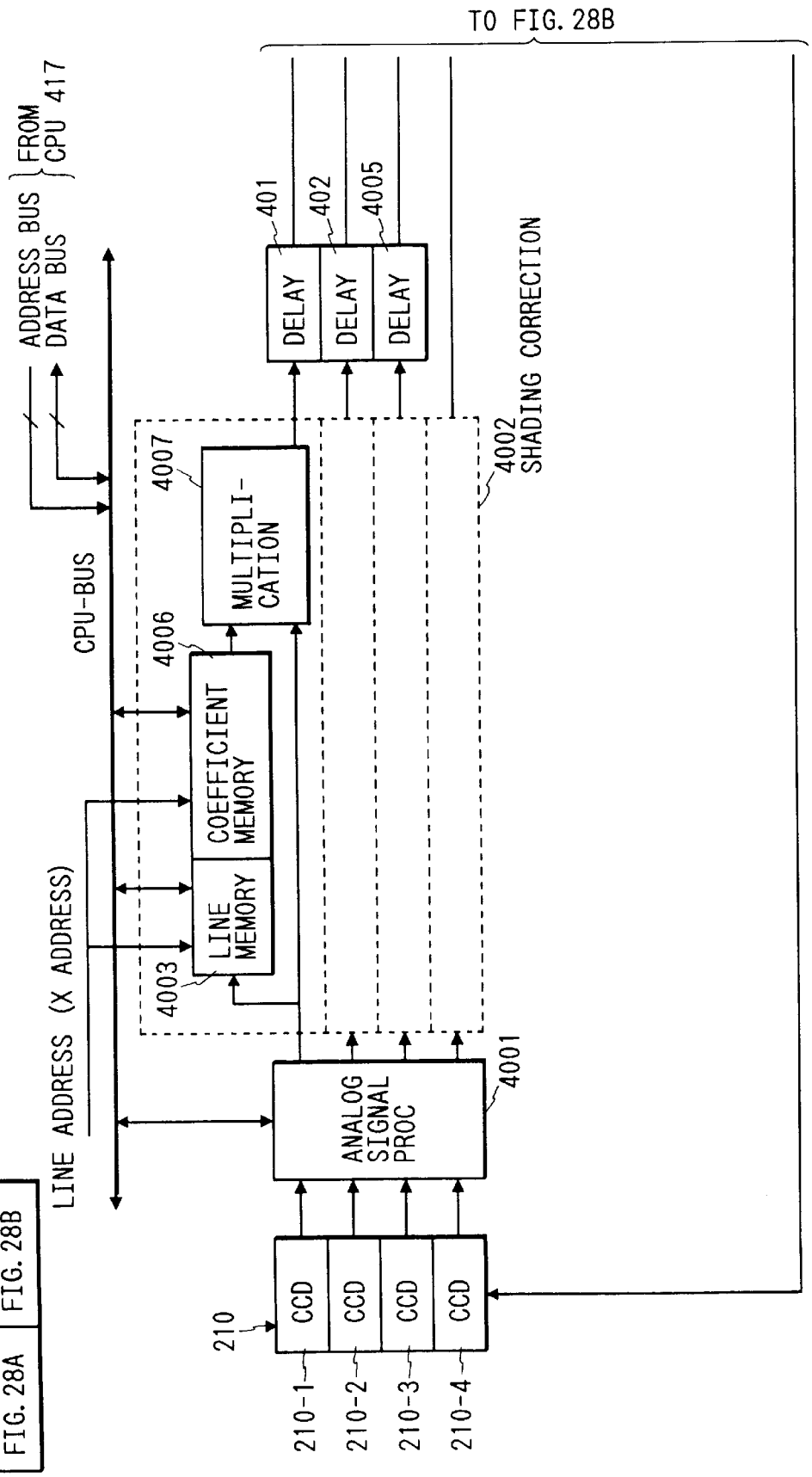

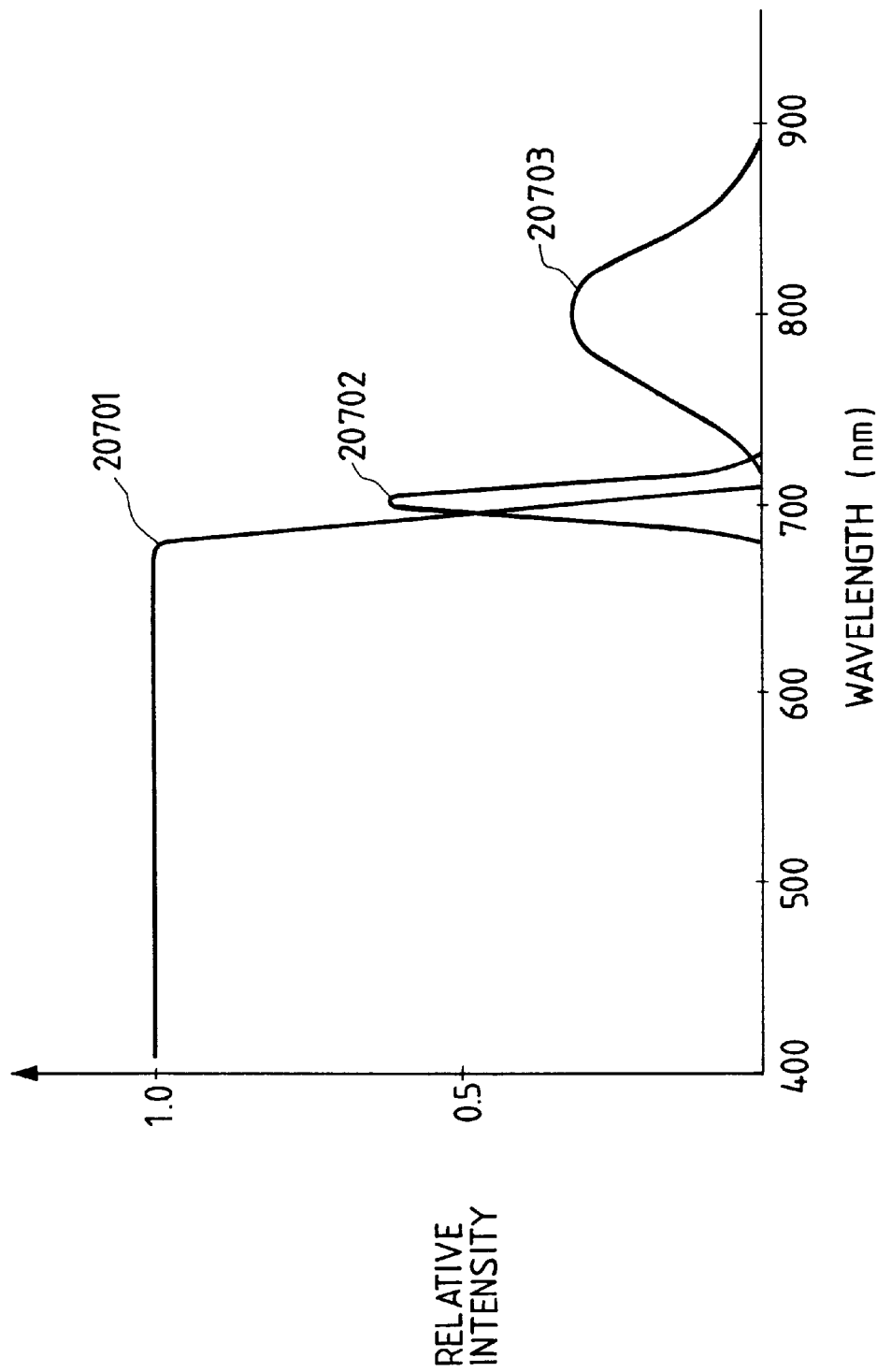

PHOTOSENSOR WITH FILTER FOR CUTTING OFF THE INPUT OF INVISIBLE INFORMATION

This application is a continuation of application Ser. No. 08/139,173, Oct. 21, 1993, now abandoned.

BACKGROUND OF THE INVENTION

1. Field of the Invention

The present invention relates to an image processing apparatus having the function of reading information of visible wavelength and of an invisible wavelength.

2. Related Background Art

An apparatus which reads data of color components having different waveform characteristics by R, G and B line sensors and processes the resulting R, G and B color component data to form an image is known.

In the above apparatus, however, it has not been contemplated to read visible ray information and invisible ray information such as infrared information by one apparatus for use in image processing.

An apparatus which illuminates a document sheet by a common lamp for R, G, and B line sensors and reads data of the respective color components has also been known.

In this apparatus, however, it has not been contemplated to read visible ray information and invisible information such as infrared information by one apparatus for use in image processing.

On the other hand, as with advances in image quality and colorization in a reproducing machine, there is a risk that bills, stamps or valuable securities will be forged with such devices. On the other hand, various systems to recognize a particular document sheet have been proposed to prevent such forgeries.

Where a picture of a document sheet is drawn by a line drawing, a method for recognizing a hue of the image document sheet by utilizing the line drawing has been proposed.

An apparatus which prints out a particular mark by fluorescent ink which reflects a visible ray (or visible light) when an ultraviolet ray irradiates to a document sheet to recognize an original and a reproduction by the presence or absence of the fluorescent ray in the printed material has been proposed.

However, when it is applied to a reproducing machine, it is difficult to detect a document sheet which makes any angle with a position on a document sheet table of the reproducing machine and hence it is difficult to prevent the reproduction.

Even if the line drawing information and the hue of the document sheet are detected, it is not always true that there is no document sheet in the general document sheets which has an equivalent characteristic to that of the particular document sheet and hence there is a risk of misdetection of a general document sheet as a reproduction inhibited document sheet.

Further, even if the reproduction is detected by the presence or absence of the fluorescence, it is not possible to prevent the reproduction itself.

In addition, in the prior art reproducing machine, it is required to actually reproduce the visible ray information of the document sheet.

To this end, even if information having an infrared wavelength characteristic is included in the document sheet, it is not used as reproduced information.

However, as the technology has advanced, it has become possible to record information on the document sheet as other than visible ray information and it has become necessary to read it as required for use as image information.

SUMMARY OF THE INVENTION

It is an object of the present invention to solve the problems encountered in the prior art apparatus.

It is another object of the present invention to efficiently read a document sheet which includes a plurality of information ranging from a visible wavelength characteristic to an invisible wavelength characteristic.

It is other object of the present invention to precisely and efficiently read those information.

It is a further object of the present invention to facilitate the manufacture of a photo-sensor.

In order to achieve the above object in the present invention, there is provided a photo-sensor comprising:

a plurality of sensing elements for reading visible information; and a plurality of sensing elements for reading invisible information;

the plurality of sensing elements being formed in one chip or on one semiconductor chip.

It is other object of the present invention to provide a novel photo-sensor which enables high speed reading.

In order to achieve the above object in the present invention, there is provided a photo-sensor comprising:

a first line sensor for reading visible information; and a second line sensor for reading invisible information;

the first and second line sensors being arranged in parallel to each other and each comprising a plurality of sensing elements.

Further, there is provided a photo-sensor comprising:

a first line sensor for producing a first color component signal;

a second line sensor for producing a second color component signal;

a third line sensor for producing a third color component signal; and a fourth line sensor for producing an invisible component signal.

It is a further object of the present invention to recognize a particular document sheet at a high speed.

In order to achieve the above object in the present invention, there is provided an image processing apparatus comprising:

line sensor means for reading visible information of a document sheet and information other than the visible information; and discrimination means for discriminating whether the document sheet is a specified document sheet or not based on the information other than the visible information;

the line sensor means simultaneously reading the visible information and the information other than the visible information.

It is other object of the present invention to precisely read visible and invisible ray information with a simple construction.

In order to achieve the above object in the present invention, there is provided an image processing apparatus comprising:

a first line sensor for reading visible information of a document sheet;

a second line sensor for reading information other than the visible information of the document sheet; and common illumination means for reading by the first line sensor and the second line sensor and used for illuminating the document sheet.

Further, there is provided an image processing apparatus comprising:

read means for reading visible information of a document sheet and information other than the visible information; and a common reference plate used to correct the visible information and the information other than the visible information.

It is other object of the present invention to effectively utilize invisible ray information.

In order to achieve the above object in the present invention, there is provided an image processing apparatus comprising:

read means for reading information other than visible information of a document sheet; and conversion means for converting the information other than the visible information to visible information.

The other objects and features of the present invention will be apparent from the following description of the embodiments and the claims taken in conjunction with the drawings.

BRIEF DESCRIPTION OF THE DRAWINGS

FIG. 3 shows the detection operation of the reproduction inhibited document sheet in the first embodiment;

FIG. 7 is comprised of FIGS. 7A and 7B showing block diagrams for detecting the position of a fluorescent mark in the first embodiment;

FIG. 11 shows a thinning operation for the fluorescent mark in the first operation;

FIG. 31 shows a characteristic of a standard white plate in the second embodiment.

DETAILED DESCRIPTION OF THE PREFERRED EMBODIMENTS

In the following embodiments, the present invention is applied to a reproduction machine although the present invention may be applied to various other apparatus such as an image scanner connected to a computer.

First Embodiment

Figure 2:
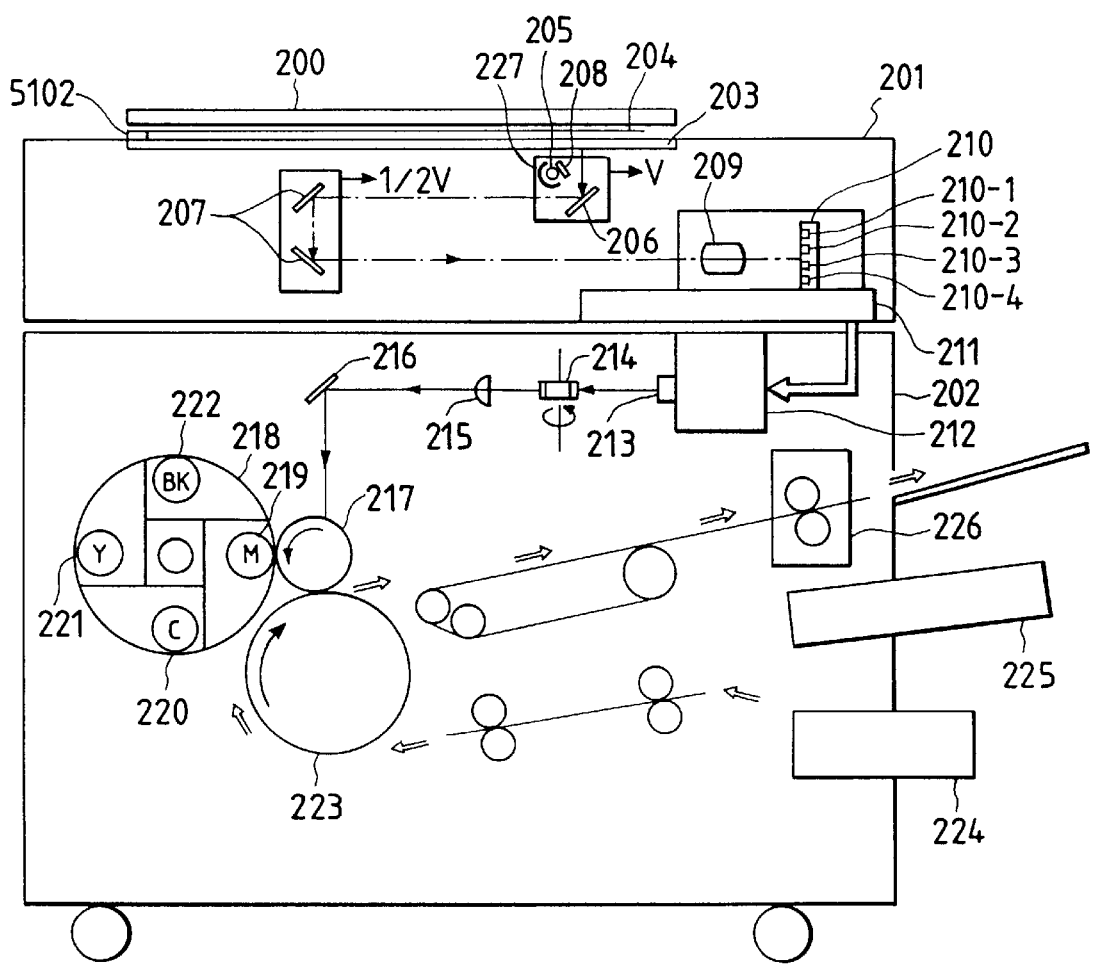
FIG. 2 shows a configuration of a color reproduction machine.

FIG. 2 shows an outer view of an apparatus in accordance with a first embodiment of the present invention.

In FIG. 2, numeral 201 denotes an image scanner unit which reads an image of a document sheet, converts it to a digital signal and digitally processes the resulting signal. Numeral 202 denotes a printer unit which forms a full color image, corresponding to the read document sheet image, onto a sheet.

In the image scanner unit 201, numeral 200 denotes thick plate having a mirror surface. A document sheet 204 on a document sheet mount glass (hereinafter a platen) 203 is irradiated by a light of a halogen lamp 205 transmitted through an infrared ray block filter 208 which eliminates infrared rays. Numeral 227 denotes a reflector which effectively reflects the light of the halogen lamp 205 to the document sheet. A reflected light from the document sheet is directed to mirrors 206 and 207 and focused onto four line CCD sensors (hereinafter a CCD) 201 by a lens 209. The line sensors generate full color information red (R), green (G) and blue (B) components based on a visible ray and an infrared information (IR) component based on an invisible ray wavelength light and send them to the signal processing unit 211. The halogen lamp 205 and the mirror 206 are mechanically moved at a velocity v and the mirror 207 is moved at a velocity (½)v normally (hereinafter a sub-scan direction) to an electrical scan direction (hereinafter a main scan direction) to scan the entire surface of the document sheet 204 on the platen 203.

Numeral 5102 denotes a standard white plate which is used to generate correction data (shading data) for correcting the scatter of read data of IR, R, G and B line sensors 210-1 to 210-3 for each pixel (scatter of photo-electric characteristics of the line sensor for each pixel). The standard white plate has a substantially white color with respect to a visible ray as shown in FIG. 31 (a characteristic of a curve 20701), and fluorescent ink which has a substantially transparent characteristic with respect to the visible ray and generates a fluorescent light, having a characteristic as shown by a curve 20703 (FIG. 3) by an excitation light having a characteristic as shown by a curve 20702 (FIG. 31), which exhibits substantially the same fluorescent characteristic as that of fluorescent information to be detected shown in FIG. 24, which is uniformly applied on the standard white plate. It is used to acquire correction data for the shading correction of output data for an infrared ray of the IR line sensor 210-1 and the shading correction for output data of the visible ray line sensors 210-2 to 210-4.

The signal processing unit 211 electrically processes the signals read by the sensors 210-1 to 210-4, decomposes them to magenta (M), cyan (C), yellow (Y) and black (Bk) color component signals, and sends them to the printer unit 202. For each document sheet scan of the image scanner unit 201, one of the M, C, Y and Bk components is sent to the printer 202 and one print operation is completed (one plane sequential image is completed) by four document sheet scans.

The M, C, Y and Bk plane sequential image signals sent from the image scanner 201 are sent to a laser driver 212 which modulates a semiconductor laser 213 in accordance with the image signals of the respective colors. The laser beam scans on a photo-conductor drum 217 through a polygon mirror 214, an f-θ lens 215 and a mirror 216.

Numeral 218 denotes a rotary developing unit which comprises a magenta developing unit 219, a cyan developing unit 220, a yellow developing unit 221 and a black developing unit 222. The four developing units alternately contact the photo-conductor drum to develop M, C, Y and Bk electrostatic latent image formed on the photo-conductor drum by corresponding toners.

Numeral 223 denotes a transfer drum around which a sheet fed from a sheet cassette 224 or 225 is wrapped so that the toner image developed on the photo-conductor drum 217 is transferred to the sheet.

In this manner, the M, C, Y and Bk colors are sequentially transferred and the sheet is ejected through a fixing unit 226.

Figure 13:
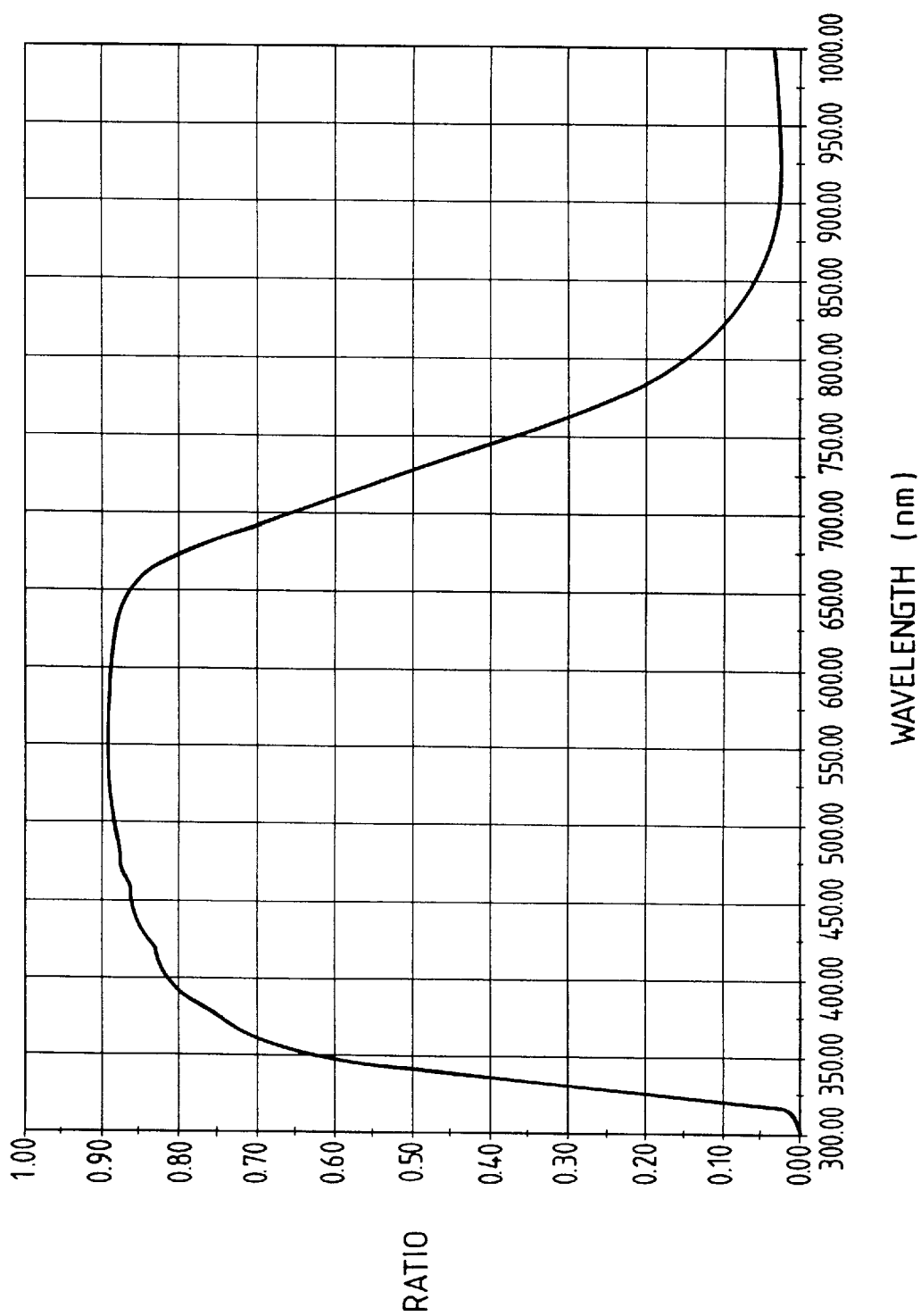
FIG. 13 shows a spectroscopic characteristic chart of a filter immediately behind of a document sheet illumination lamp in the first embodiment.
Figure 14:
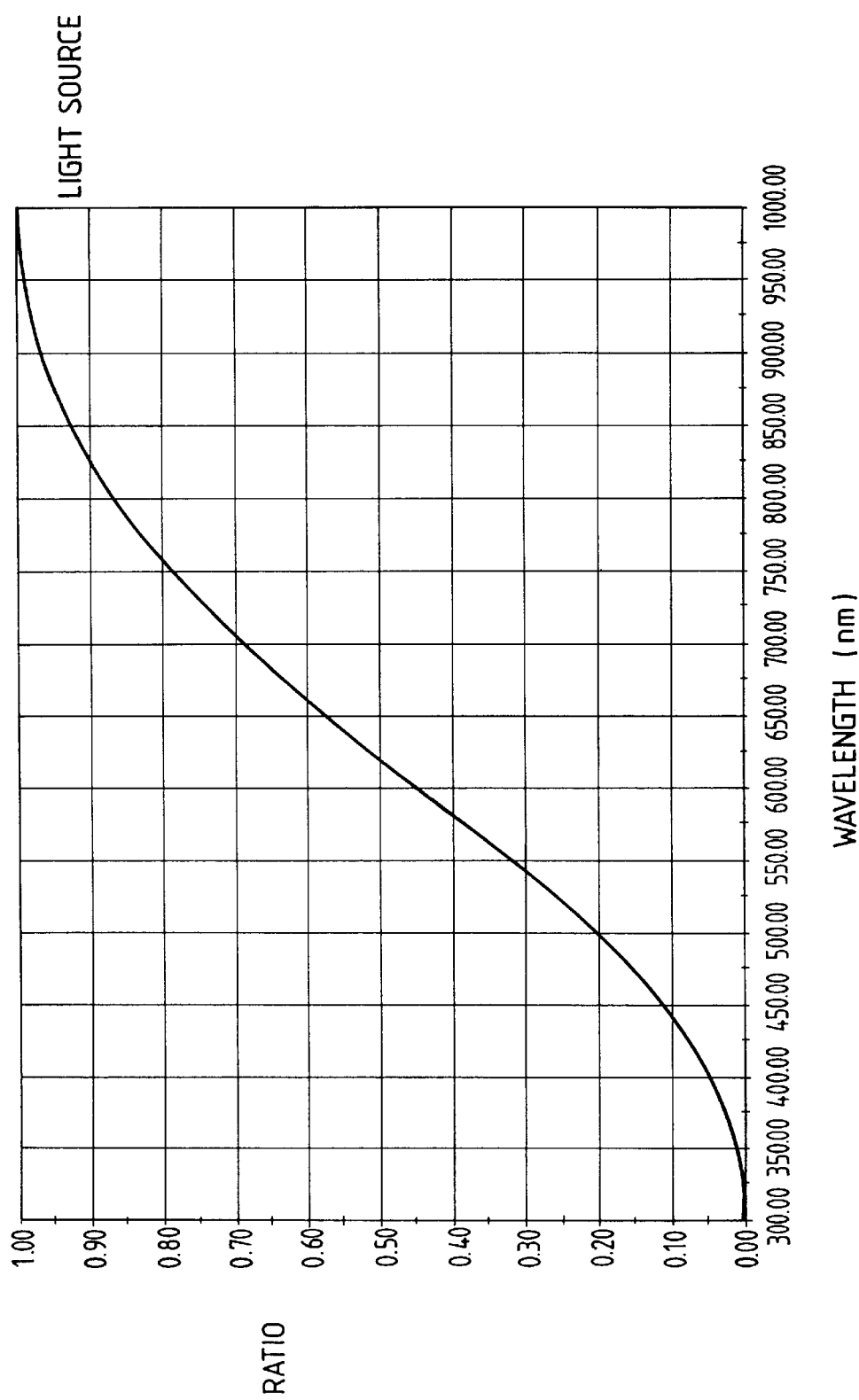
FIG. 14 shows a spectroscopic characteristic chart of the document sheet illumination lamp in the first embodiment.

FIG. 13 shows a spectroscopic characteristic of an infrared ray block filter 208 arranged between the halogen lamp 205 for illuminating the document sheet and the platen glass 203. By the filter 208, infrared rays higher than approximately 700 nm of the spectroscopic characteristic of the halogen lamp 205 shown in FIG. 14 is eliminated.

The halogen lamp 205 is used for both reading the visible information and reading the infrared fluorescent information other than the visible ray information, and has illumination waveform components necessary for reading the two types of information. By sharing the illumination system, illumination light having different wavelength components for reading the respective information can effectively illuminate the document sheet without requiring a plurality of independent illumination systems for reading the respective information. In this manner, the construction of the illumination system of the apparatus may be simplified.

Figure 15A:
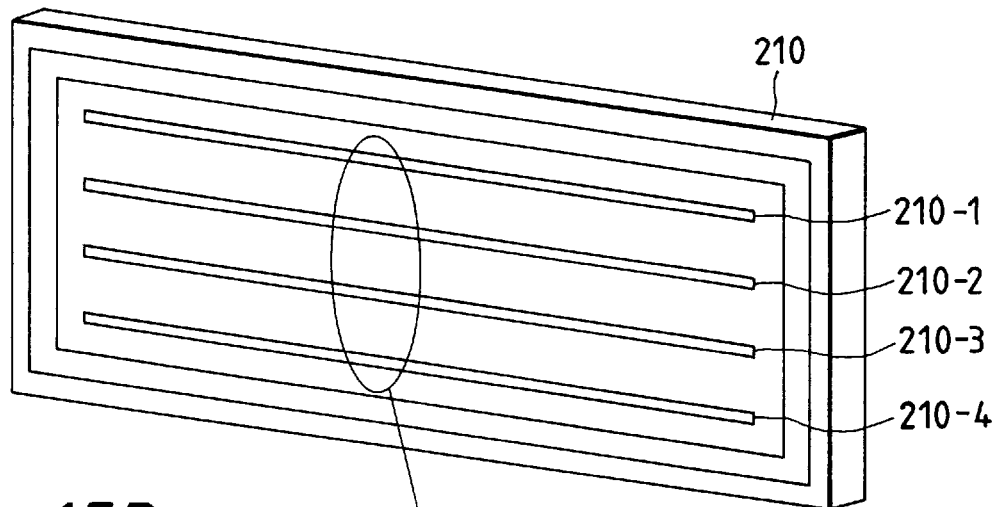
FIGS. 15A and 15B show the configuration of a CCD sensor in the first embodiment.
Figure 15B:
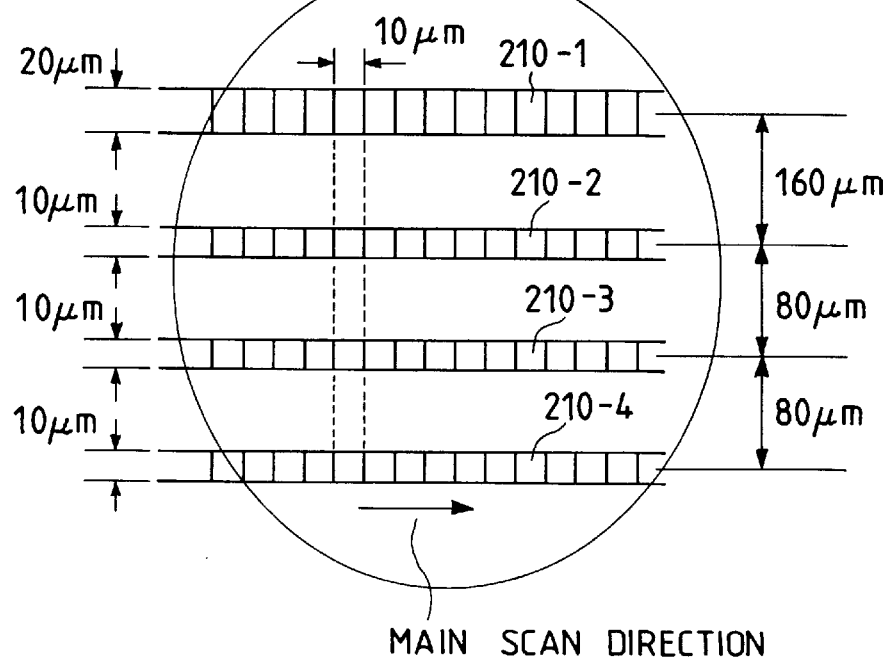

FIGS. 15A and 15B show a construction of the CCD 210 used in the embodiment.

In FIG. 15A, numeral 210-1 denotes a photo-sensor line (CCD line sensor) for reading an infrared ray (IR) having a wavelength characteristic other than the visible ray, and numerals 210-2, 210-3 and 210-4 denote photo-sensor lines (CCD line sensors) for reading the R, G and B wavelength components, respectively.

The four photo-sensor lines having different optical characteristics are monolithically formed on one silicon chip and arranged in parallel with each other so that the IR, R, G and B line sensors read the same line of the document sheet. Namely, the sensing elements for acquiring the visible and invisible ray information are formed on one semiconductor chip.

By using the CCD line sensors of this type, the optical system such as a lens for focusing the document sheet image on the line sensors can be shared for the visible ray reading and the invisible ray reading and the construction may be simplified.

In addition, the precision of the optical adjustment for adjusting the focal position may be enhanced and the adjustment is facilitated. Further, by the construction of the CCD sensors described above, the shift of the read position is reduced for the light other than the visible and invisible rays.

FIG. 15B shows an enlarged view of the photo-sensor line. Each sensor has a length of 10 $\mu$m per pixel in the main scan direction. Each sensor has 500 pixels in the direction of the main scan (the line direction of the CCD 210) so that it reads the short axis of a size A3 document sheet (297 mm) at a resolution of 400 dpi (dots per inch).

The line-to-line distance between the R, G and B sensors is 80 $\mu$m and they are spaced by 8 lines for a resolution of 400 lpi (lines per inch) in the sub-scan direction (the direction of movement of the optical system).

The distance between the IR sensor 210-1 and the R sensor 210-2 is 160 $\mu$m (16 lines) which is double of other line spacing. By increasing the spacing between the visible ray line sensors and the invisible ray line sensor, it is easy to mount a filter when the line sensors are monolithically formed on the silicon chip. Further, the structural problem of the charge transfer unit is also resolved as will be described later.

Further, by continuously arranging the visible ray sensors 210-2 to 210-4, it is easy to mount the IR block filter.

Each of the R, G and B sensors 210-2 to 210-4 has an aperture of 10 $\mu$m in the sub-scan direction and the IR sensor 210-1 has an aperture of 20 $\mu$m which is double of that of the sensors 210-2 to 210-4 so that the IR sensor 210-1 can read an infrared fluorescent light. In general, the intensity of the fluorescent light is only less than half of that of the excitation light and it may be even 10%. Thus, in the present embodiment, the photo-sensing area per pixel (element) is increased at a sacrifice of the read resolution of the infrared ray of the IR sensor 210-1 in order to secure a desired dynamic range of the read signal.

In the present embodiment, the dynamic range is secured by increasing the length of the pixel in the sub-scan direction of the IR sensor 210-1. Alternatively, the length of the pixel in the main scan direction may be increased by the sacrifice of the resolution in the main scan direction rather than the sub-scan direction.

Each of the line sensors has an optical filter formed on the surface thereof in order to attain a predetermined IR, R, G or B spectroscopic characteristic.

Figure 19:
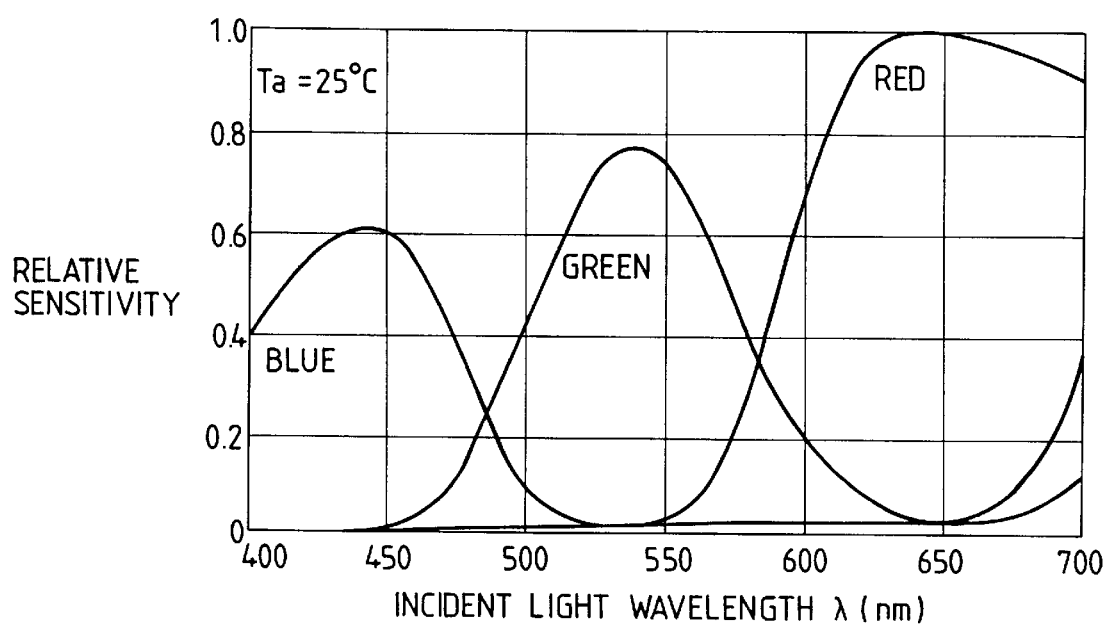
FIG. 19 shows a spectroscopic sensitivity characteristic of a visible ray line sensor in the first embodiment.
Figure 20:
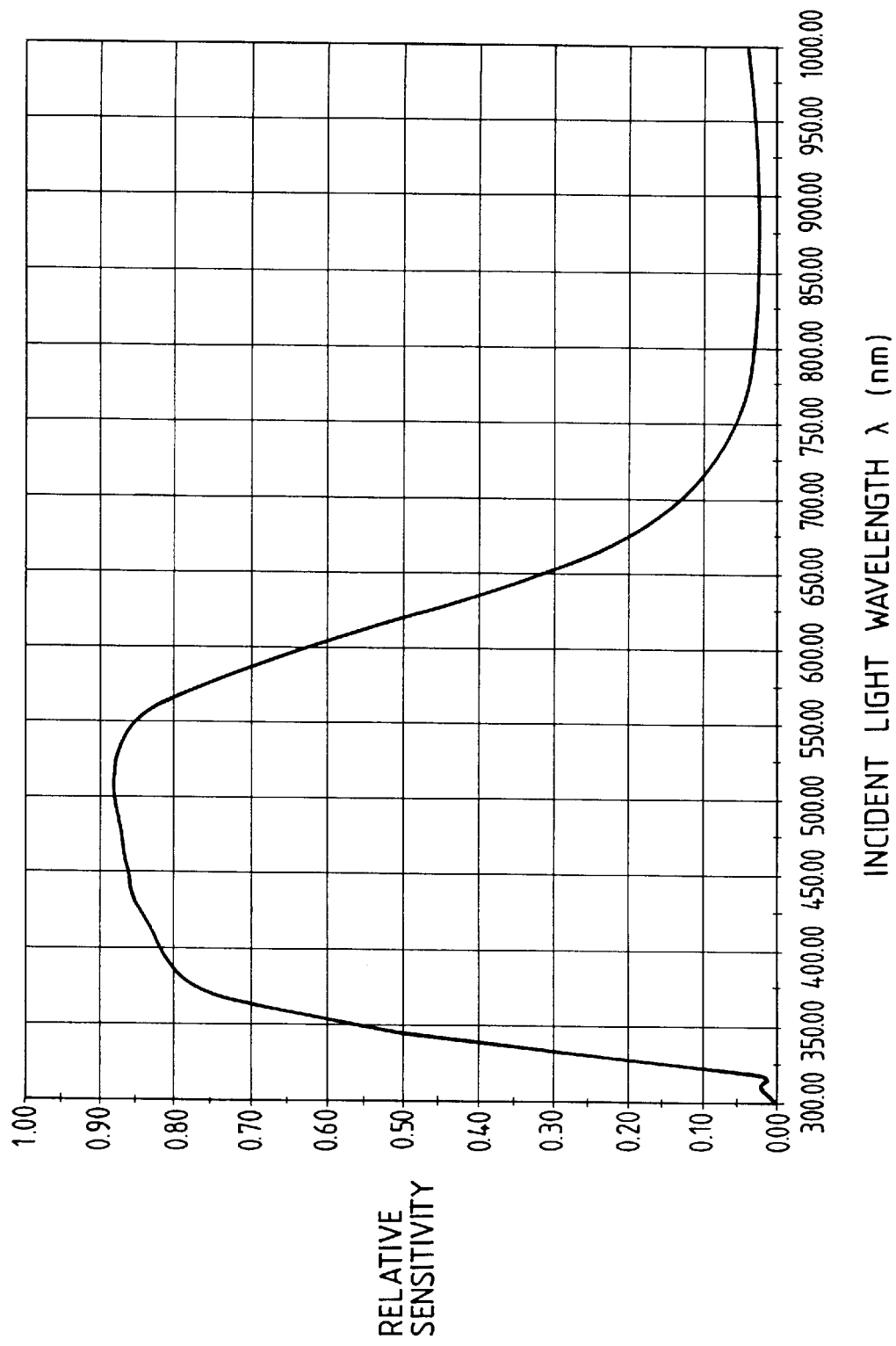
FIG. 20 shows a spectroscopic sensitivity characteristic of the visible ray line sensor in the first embodiment.

Referring to FIGS. 19 and 20, the spectroscopic characteristics of the R, G and B line sensors CCD 210 are explained.

FIG. 19 shows characteristics of filters mounted on the R, G and B line sensors used in the prior art. As seen from FIG. 19, the prior art R, G and B filters have a sensitivity to an infrared rays of 700 nm or higher. In the prior art, an infrared ray block filter having a characteristic shown in FIG. 20 is used for the lens 209. In the present embodiment, since it is necessary for the IR sensor 210-1 to read the infrared component of the light transmitted through the lens 209, it is not permitted to impart the function of the infrared ray block filter to the lens 209.

Thus, in order to eliminate the influence of the infrared ray, the filters attached to the R, G and B filters have both the characteristic of the respective colors of FIG. 19 and the characteristic of the infrared ray elimination of FIG. 20.

Figure 16:
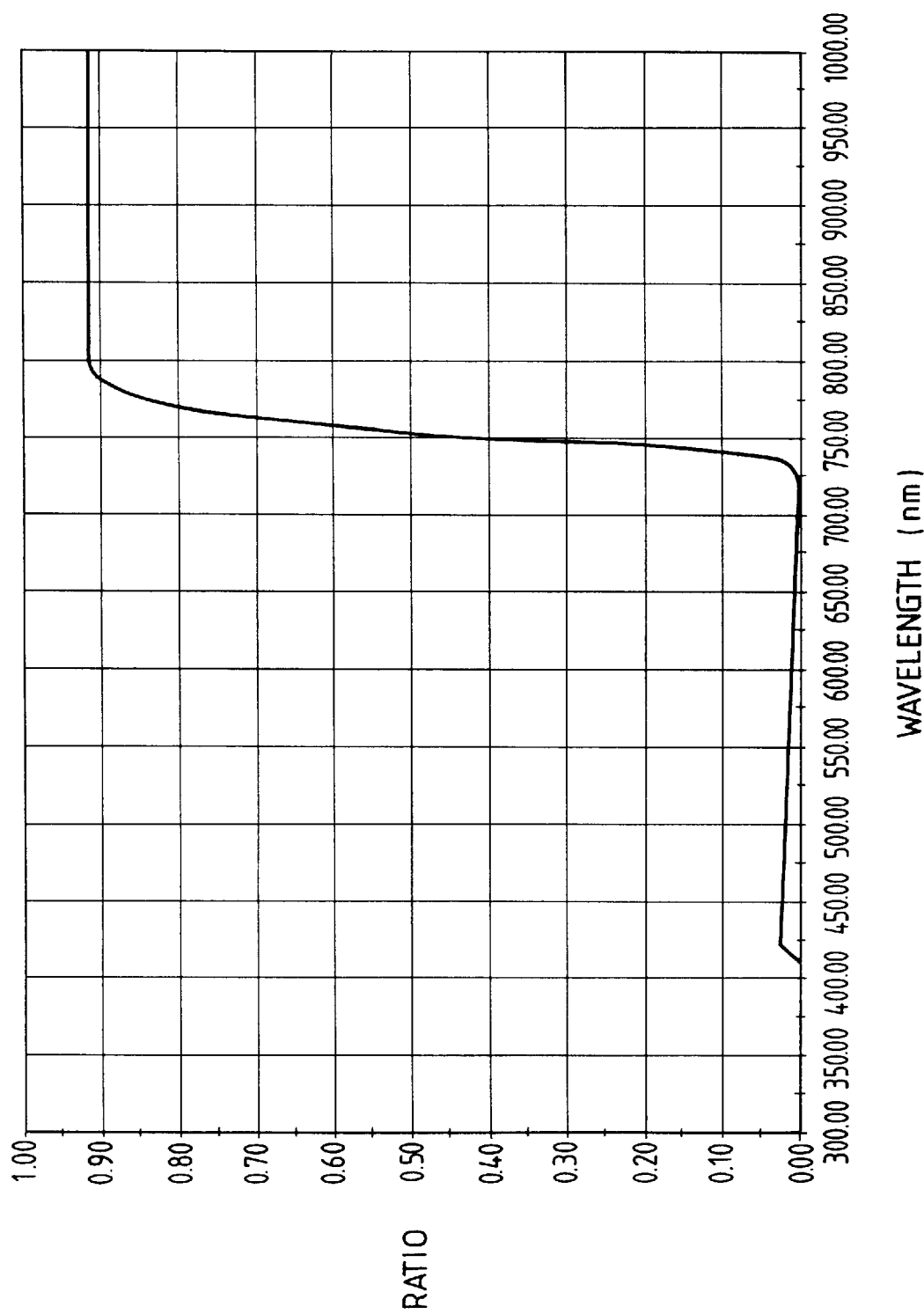
FIG. 16 shows a filter characteristic of an infrared read sensor in the first embodiment.

FIG. 16 shows a characteristic of the visible ray block filter mounted to the IR sensor 210-1. It functions to eliminate the visible ray component applied to the IR sensor which reads the fluorescent component of the infrared ray.

Figure 17:
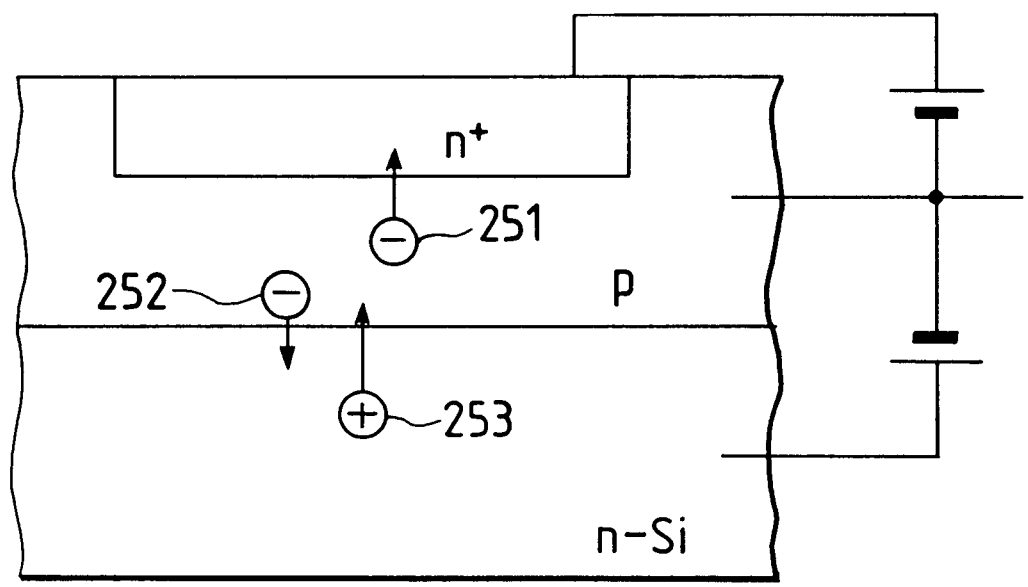
FIG. 17 shows photo-electric conversion of the CCD in the first embodiment.

FIG. 17 shows a structure of a photo-diode of the CCD. The photo-diode has a pnp structure and an upper np junction is reversely biased to form the photo-diode. Carriers 251 generated at the top of the p layer are absorbed by the upper np junction and taken out as a signal.

A long wavelength light such as an infrared ray generates the carrier 252 at a deep area of the p-layer or generates carriers 253 in an n-layer of a substrate. The carriers generated at the deep area are absorbed by the pn junction as shown and are not read as a signal.

Figure 18:
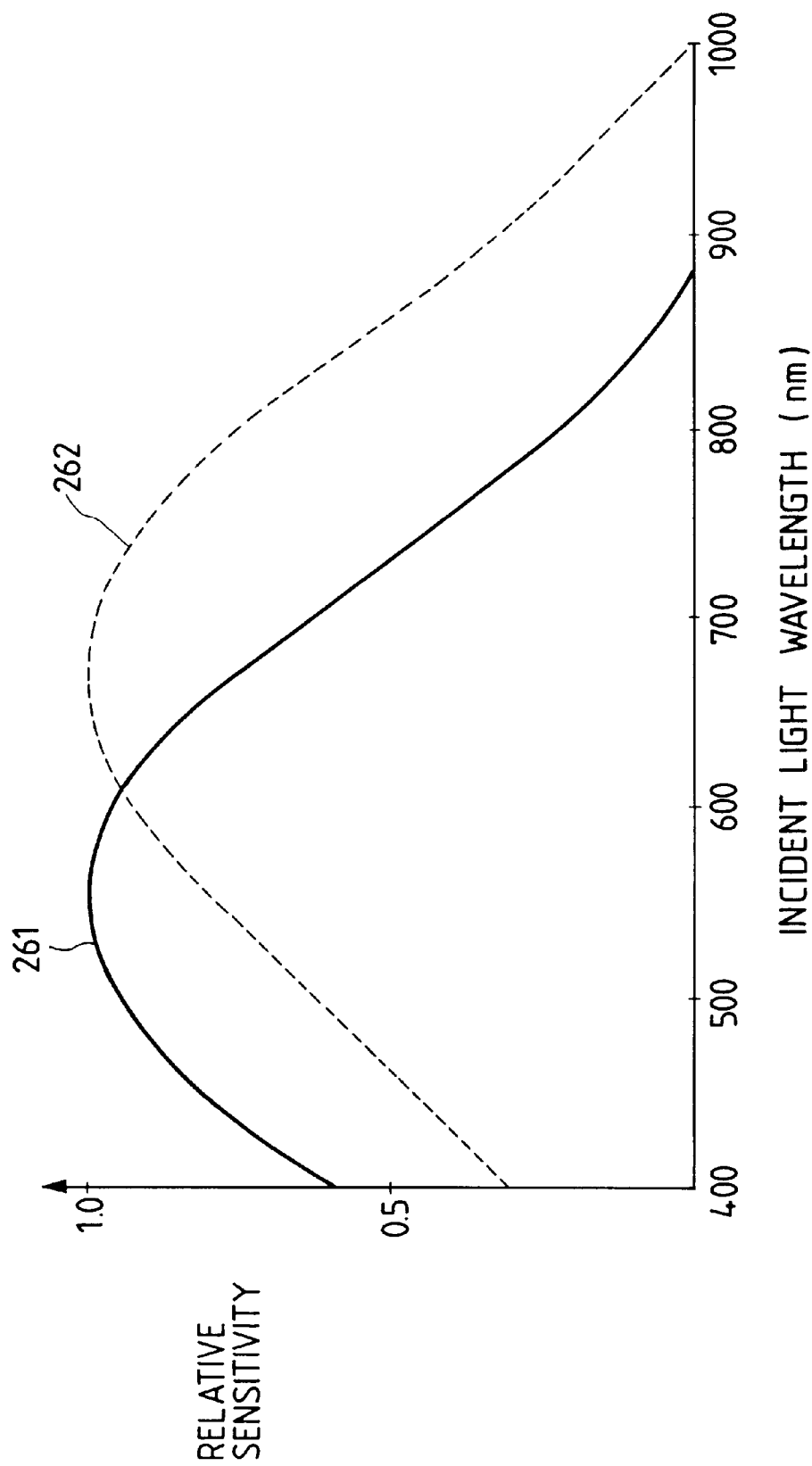
FIG. 18 shows a spectroscopic sensitivity characteristic of the CCD in the first embodiment.

A solid line characteristic curve 261 in FIG. 18 shows a spectroscopic characteristic of a conventional visible ray CCD. It exhibits a drop of sensitivity of approximately 20% for an infrared ray of 800 nm having a peak at 550 nm. The thickness of the p-layer of the R, G and B sensors having the characteristic 261 is approximately 1000 nm.

In the present embodiment, the CCD of the IR read sensor 210-1 has a p-layer which is thicker than other CCD's 210-2 to 210-4 of the R, G and B sensors on the same silicon chip so that it has a sensitivity to the infrared ray. Namely, the thickness of the p-layer of the IR sensor 210-1 is approximately 1500 nm so that it has a peak sensitivity to infrared rays having a wavelength of 700 nm to 800 nm. The spectroscopic characteristic of the IR sensor of the present embodiment is shown by 262 in FIG. 18.

In FIGS. 15A and 15B, the spacing between the IR sensor 210-1 and the R sensor 210-2 is double of that of other sensors because the thickness of the p-layer of the IR sensor 210-1 is thick and hence it is necessary to assure the structural isolation of the photo-diode and serial charge transfer units formed on the opposite sides thereof. The IR sensor 210-1 having a different structure such as different thickness of the photo-sensing layer is formed externally of the other sensors 210-2 to 210-4 to simplify the construction of the CCD.

By increasing the line-to-line spacing, the spacing between the charge transfer unit for the IR signal and the charge transfer unit for the R signal is set to be wider than the spacing between the charge transfer units of R-G and G-B. Thus, the influence of the cross-talk imparted by the simultaneously read R signal, having a relatively large signal level, on the infrared fluorescent light, which is a small signal, can be reduced. By arranging the IR sensor outermost of the four line sensors, the cross-talk from other signals is reduced.

Figure 1:
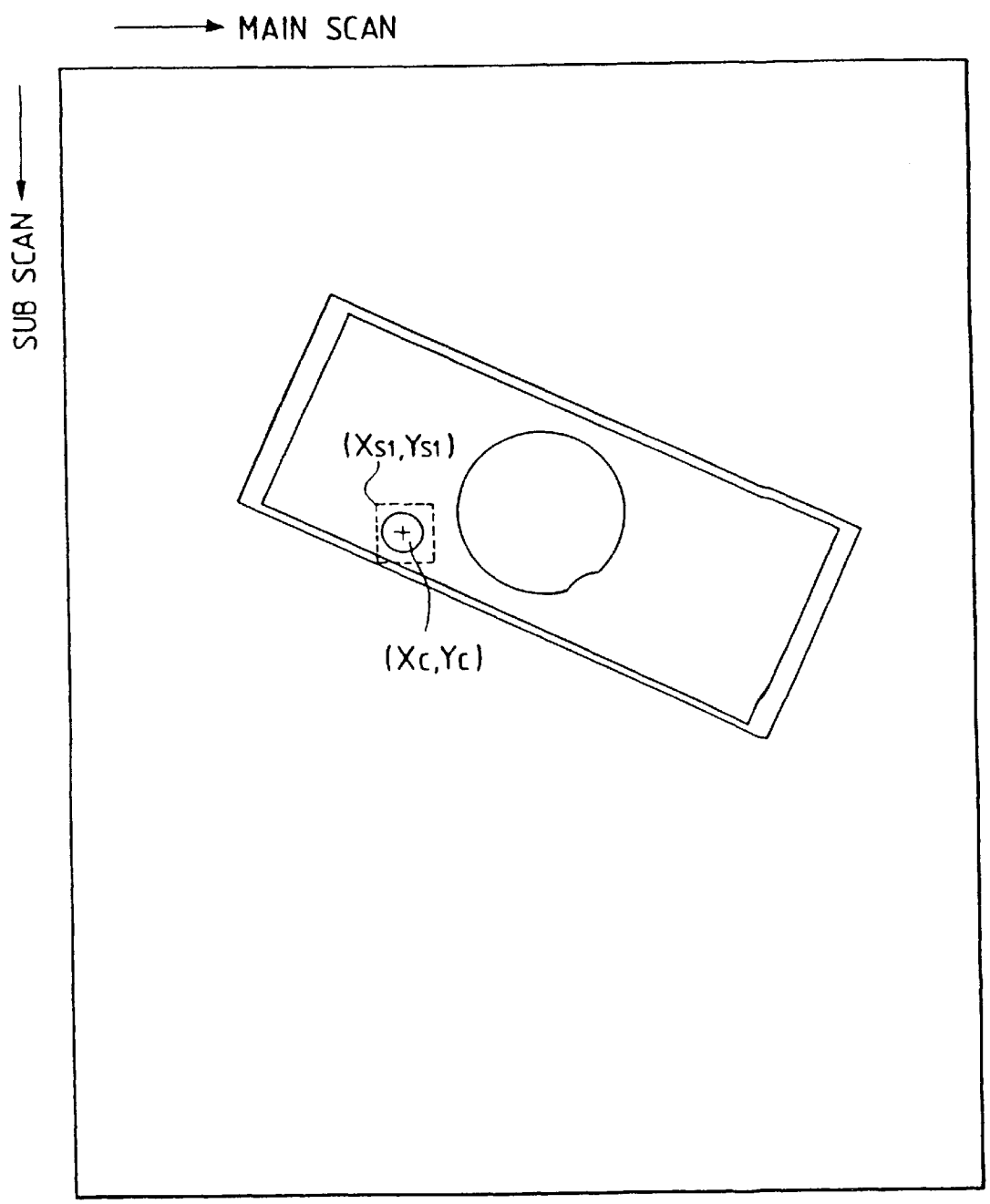
FIG. 1 shows the detection status of an identification mark of a reproduction inhibited document sheet in a first embodiment.

In the present embodiment, a document sheet having a similar mark to that of a red stamp printed by an ink having a fluorescent characteristic with respect to an infrared ray at a predetermined position on the document sheet as shown in FIG. 1 is assumed as an example of a reproduction inhibited document sheet which should not be reproduced. When the mark is detected in the infrared signal red from the document sheet mounted on the document sheet table, the normal image formation operation is inhibited. The manner of inhibition may be one of various ways such as changing image data or turning off the power to the apparatus.

The size and the mark of the reproduction inhibited document sheet are not limited to those shown in FIG. 1.

Figure 24:
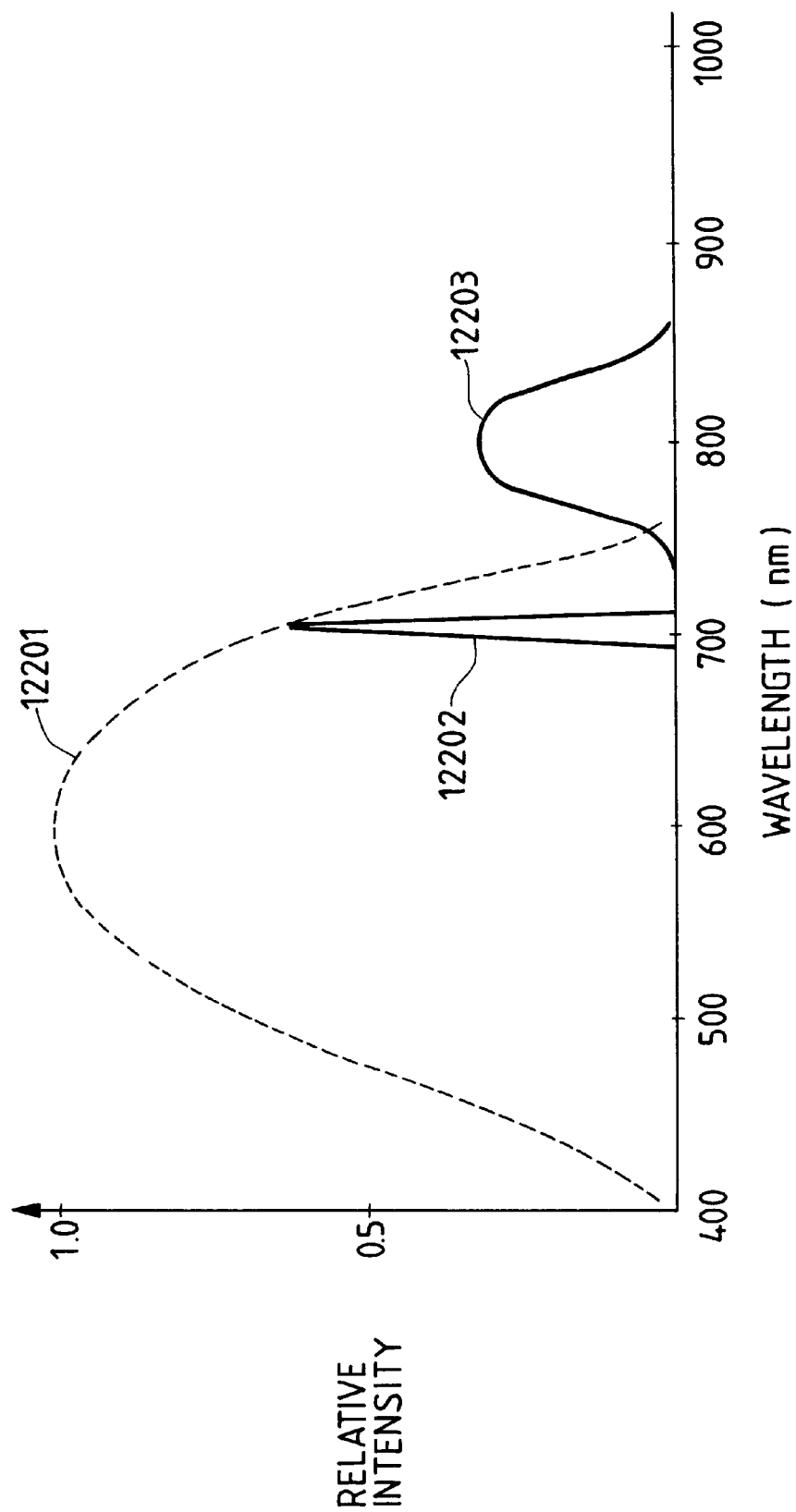
FIG. 24 shows a fluorescent characteristic in the first embodiment.

FIG. 24 shows a reflection spectroscopic characteristic of a reproduction inhibit identification mark (hereinafter an identification mark) contained in the copy inhibited document sheet.

In FIG. 24, numeral 12201 denotes a spectroscopic characteristic which is a combination with the infrared ray block filter 208 arranged between the halogen lamp 205 and the platen glass 203. An infrared ray component 12202, near approximately 700 nm, of the spectroscopic characteristic is used as excitation light and the infrared fluorescent light having a peak at approximately 800 nm, is detected from the identification mark shown by 12203 to identify the reproduction inhibited document sheet. In the present embodiment, the halogen lamp is used as a document sheet illumination lamp which simultaneously emits at least the visible ray and the excitation light component to the infrared fluorescent light, and the filter 208 is applied thereto to prevent the wavelength component (12203 in FIG. 24) of the infrared fluorescent light (the reflected light from the document sheet) from reading the document sheet plane from the halogen lamp.

In the present embodiment, the identification mark is formed by a material which generates an infrared fluorescent light when excited by the infrared ray (12202 in FIG. 24). Thus, the characteristic of the identification mark to the visible ray can be set to any desired value. In the present embodiment, the infrared fluorescent ink which exhibits a substantially transparent characteristic with respect to the visible ray is used so that the infrared fluorescent light is detected without being recognized by a user of the apparatus because the presence of the identification mark in the reproduction inhibited document sheet and the fact that the document sheet is the specific document sheet having the reproduction thereof inhibited is detected.

A principle of the reading of the IR fluorescent light is briefly explained. The document sheet 204 on the platen glass 203 is illuminated by the light of the halogen lamp 205 transmitted through the infrared ray block filter 208. As described above, the intensity of the fluorescent light at 800 nm emitted from the identification mark is less than one half of that of the excitation light, such as 10% thereof. Accordingly, the long wavelength component including the infrared fluorescent light wavelength component of 800 nm of the light directly reflected from the document sheet is blocked by the infrared ray block filter 208 so that the waveform component of 800 nm directed to the CCD 210 is essentially the fluorescent component. In this manner, the light irradiating to the document sheet from the light source has the fluorescent spectroscopic component emitted from the identification mark blocked and the fluorescent excitation light of 700 nm fully illuminates the document sheet so that as S/N ratio of the fluorescent signal from the identification mark is improved.

The reflected light from the document sheet is focused on the line sensors for reading the red (R), green (G) and blue (B) components of the full color information and the infrared ray information (IR) component on the sensors of the CCD 210 by the lens 209.

As described above, the R, G and B filters which have the characteristics of FIG. 20 for fully attenuating the excitation light of 700 nm are mounted on the R, G and B line sensors 210-2 to 210-4. Accordingly, full color reading is attained without being affected by the infrared fluorescent light excitation wavelength and the infrared fluorescent light.

Since the filter which blocks the wavelength of less than 700 nm is mounted on the IR sensor 210-1 as shown in FIG. 16, only the infrared fluorescent component 12203 of FIG. 24 is read. By this filter, the infrared fluorescent light can be extracted in parallel with the reading of the document sheet and the recording of the image, and an extra document sheet scan for detecting only the identification mark by the infrared fluorescent light by the pre-scan is not necessary. For a malicious user who may not place a reproduction inhibited document sheet in the pre-scan but may place it in the real scan, the reproduction is effectively inhibited in the present embodiment.

In this manner, when the visible color area of the document sheet and the infrared ray area of the identification mark are read in parallel in one scan, both areas are well separated.

Figure 4B:
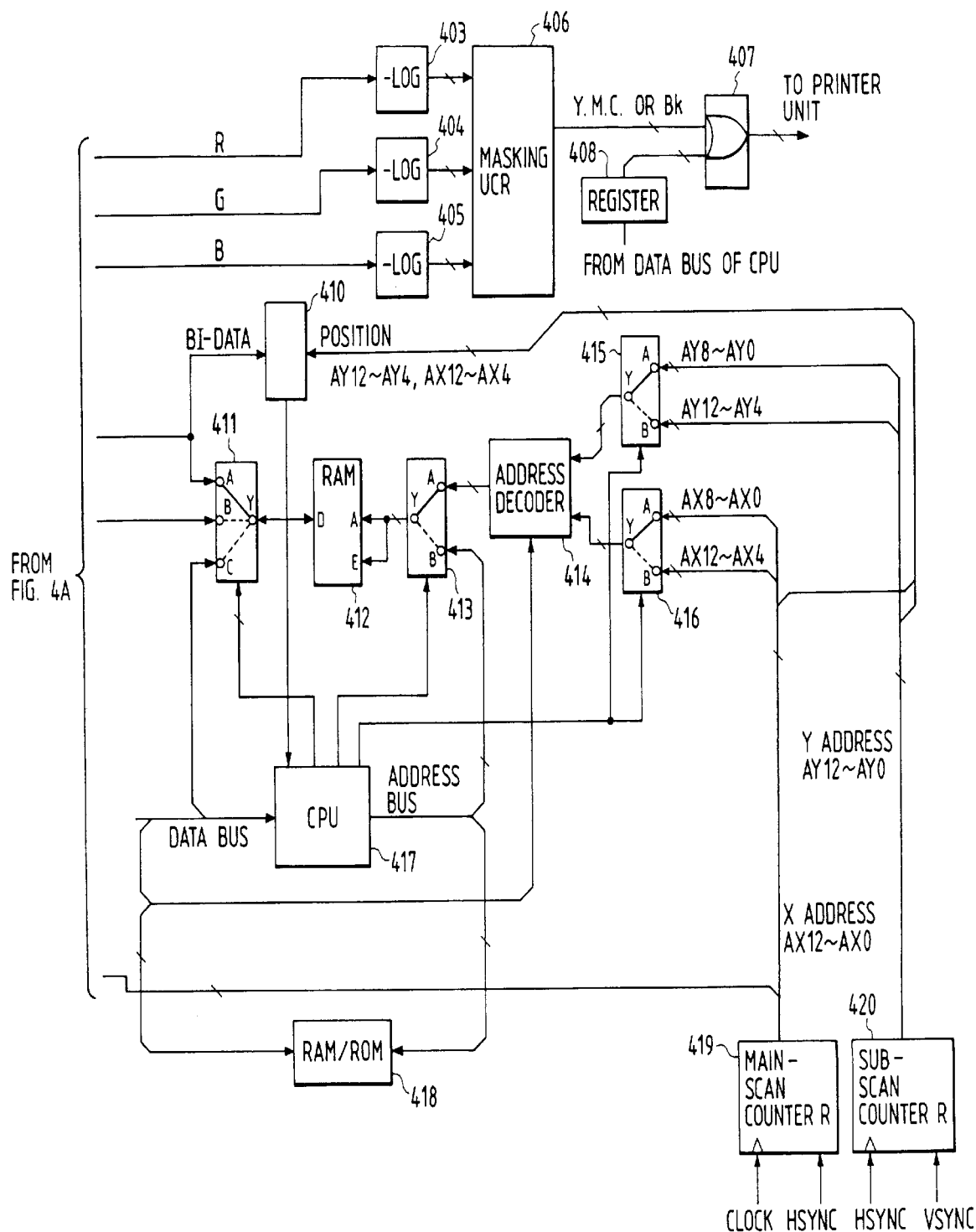
FIG. 4 is comprised of FIGS. 4A and 4B showing the configuration of a signal processing unit in the first embodiment.

FIGS. 4A and 4B show a construction of the signal processing unit 211 of the image scanner unit 201 and a block diagram of a flow of an image signal therein. The image signal outputted from the CCD 210 is applied to an analog signal processing unit 4001 where it is converted to an 8-bit digital image signal, which is then applied to a shading correction unit 4002. Numeral 4008 denotes a decoder which decodes a main scan address from a main scan address counter 419 to generate a CCD drive signal for each line, such as a shift pulse and a reset pulse.

Figure 21:
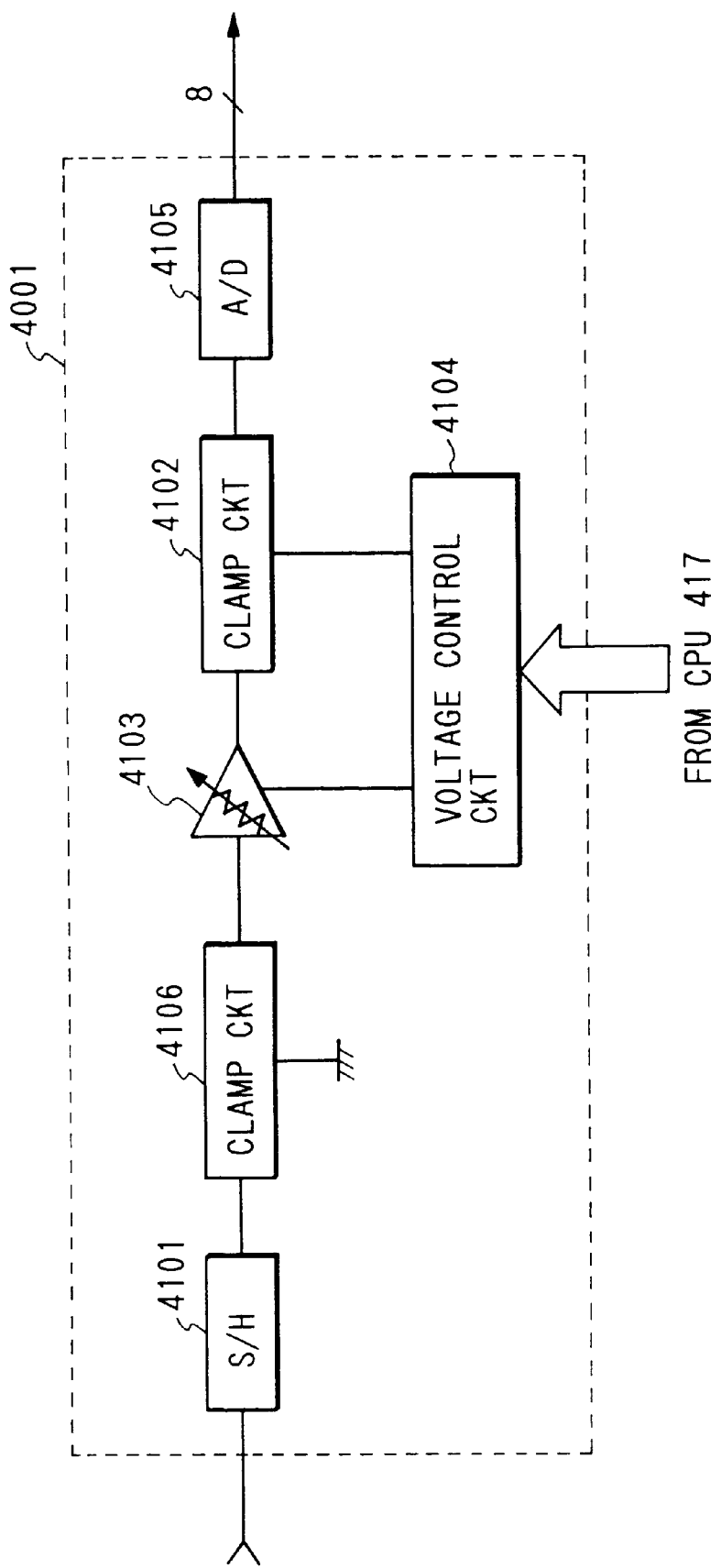
FIG. 21 shows an analog signal processing unit in the first embodiment.

FIG. 21 shows a block diagram of the analog signal processing unit 4001. Since the IR, R, G and B processing circuits are identical, one of them is shown. The image signal outputted from the CCD 210 is sampled and held by a sample and hold circuit (S/H circuit) 4101 to stabilize the waveform of the analog signal. The CPU 417 controls a variable gain amplifier 4103 and a clamp circuit 4102 so that the image signal may fully utilize the dynamic range of the A/D converter 4105, which converts the analog image signal to the 8-bit digital image signal.

The 8-bit digital image signal is shading-corrected by the shading correction unit 4002 by the shading correction technique.

For the read signal from the IR sensor 210-1, the CPU 417 stores one line of read infrared fluorescent signal from the standard white plate 5102 into the line memory 4003, determines a multiplication factor for each pixel to make the read data of each pixel recorded in the line memory reach the level 255, and stores them in one line coefficient memory 4006. In the actual reading of the document sheet, the multiplication factor for each pixel is read from the coefficient memory in synchronism with the output of the pixel by the line reading of the IR sensor 210-1, and it is multiplied with the pixel signal from the IR sensor 210-1 by the multiplier 4007 to effect the shading correction for the infrared fluorescent light.

In the shading correction for the R, G and B signals, one line of read signal from the standard white plate 5102 is stored in the line memory, the multiplication coefficient to make the value in the line memory be 255 is stored in the coefficient memory, and the read signal is multiplied with the multiplication factor from the coefficient memory for each pixel by the multiplier, as they are in the shading correction for the IR signal.

As shown in FIGS. 15A and 15B, since the photo-sensing elements 210-1, 210-2, 210-3 and 210-4 of the CCD 210 are arranged at the predetermined intervals, the spatial shift in the sub-scan direction is corrected by line delay elements 401, 402 and 4005. Specifically, the IR, R and G signals which read the previous document sheet information in the sub-scan direction for the signal B are delayed in the sub-scan direction to align to the signal B. Numerals 403, 404 and 405 denote logarithmic converters which comprise look-up table ROM's to convert the R, G and B brightness signals to C, M and Y density signals. Numeral 406 denotes a known masking and UCR circuit. While a detailed description thereof is omitted, the Y, M, C and Bk signals for the output are sequentially outputted in a bit train of a predetermined bit length such as 8 bits for each read operation.

Figure 23:
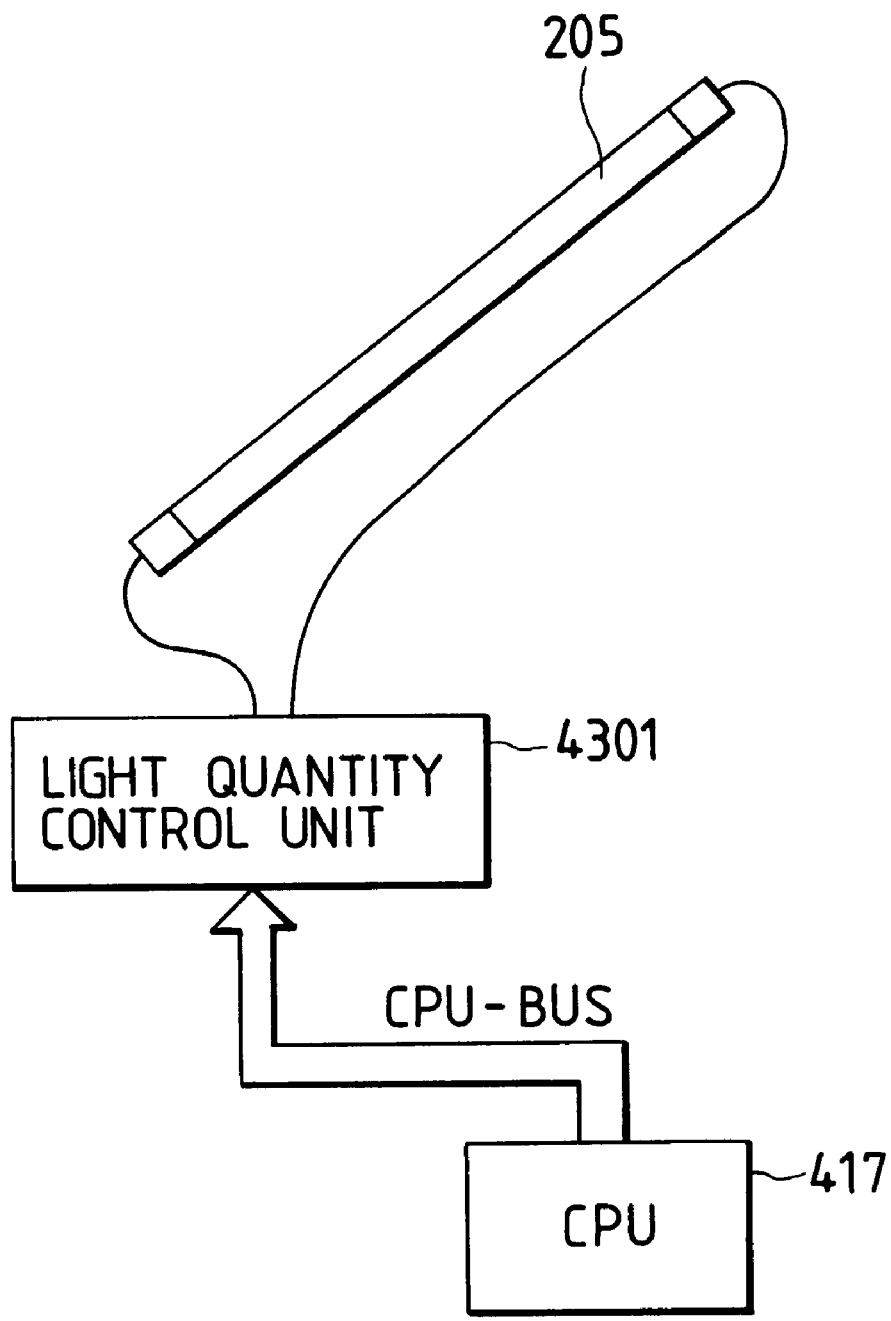
FIG. 23 shows a light control block of the document sheet illumination lamp in the first embodiment.

FIG. 23 shows a block diagram of a light intensity control unit of the halogen lamp 205 and numeral 4301 denotes a light intensity control unit of the halogen lamp.

Figure 22B:
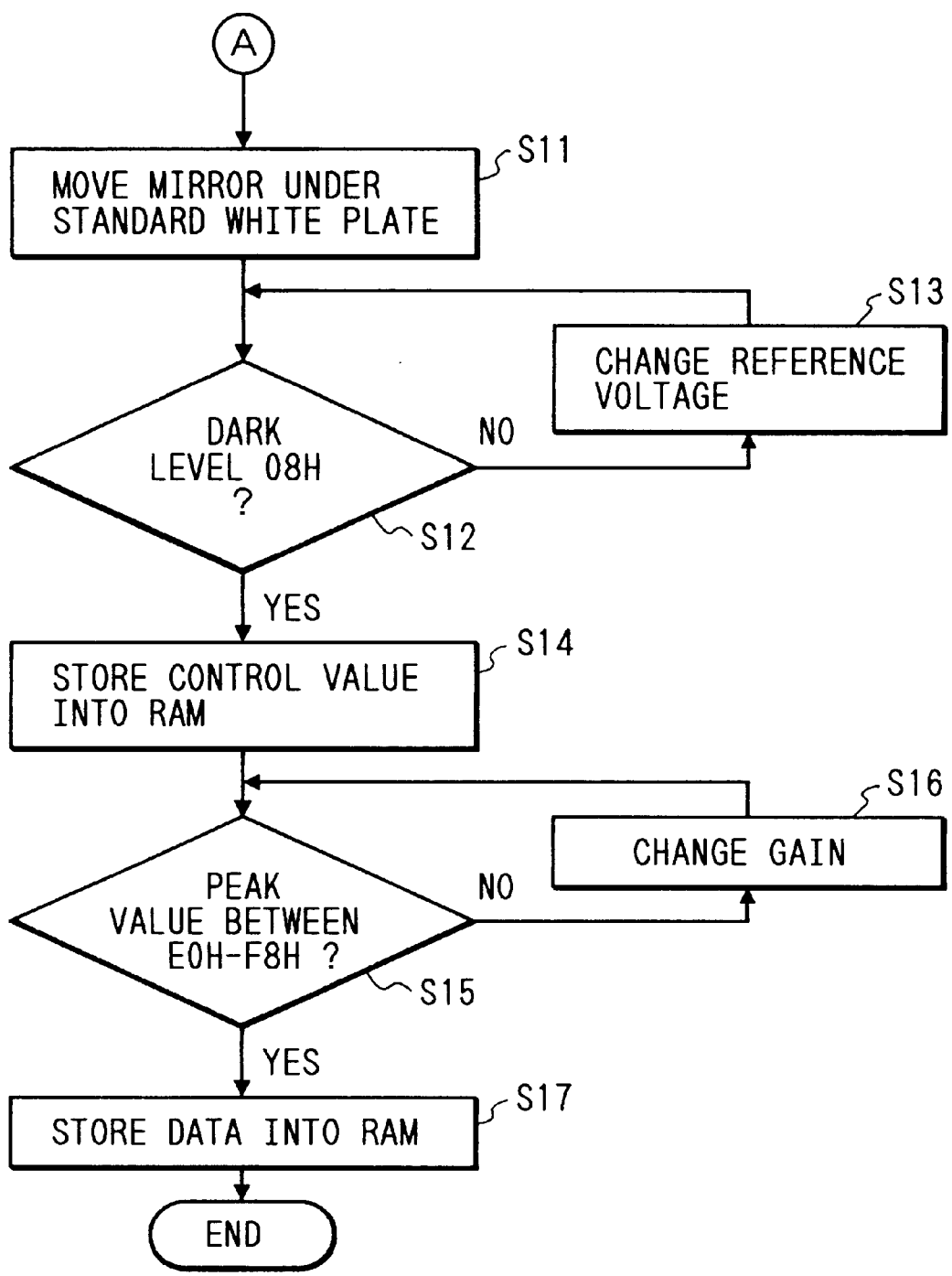
FIG. 22 is comprised of FIGS. 22A and 22B showing a control flow of dimmer and circuit gain in the first embodiment.

A method for controlling the light intensity of the halogen lamp 205 and a method for controlling the variable gain circuit 4103 and the clamp circuit 4102 are explained with reference to flow charts of FIGS. 22A and 22B.

The analog signal processing unit 4001 adjusts the amplification factor of the variable gain amplifier 4103 based on the image data by reading the standard white plate 5102 for the R, G and B signals and adjusts the control voltage of the clamp circuit 4102 by the voltage control circuit 4103 based on the image data in the absence of the light to the CCD 210 so that the dynamic range of the A/D converter 4105 can be fully utilized. For the IR signal, a similar adjustment to that for the R, G and B is effected based on the image data derived when the infrared fluorescent information is read from the standard white plate 5102.

When the adjustment mode is started by a console unit not shown, the reflection mirror 206 is moved under the standard white plate 5102 and a predetermined gain for the halogen lamp is set to the variable gain amplifier 4103 (step 1). The image data in the absence of the light to the CCD 210 is read into the line memory (shading RAM) 4003, the read data is processed by the CPU 417 to control the voltage control circuit 4103 so that a mean value of one line of image data most approaches 08H and adjusts the reference voltage of the clamp circuit 4102 (steps 2 and 3), and the adjusted control value is stored in the RAM 418 associated with the CPU 417 (step 4).

Then, the halogen lamp 205 is turned on and the image data derived by reading the standard white plate 5102 is read into the line memory 4003 and the light intensity control unit 4301 is controlled by the CPU such that the peak of the signal G is between D0H and F0H (steps 5 and 6, adjustment of the halogen lamp) and the control value after the adjustment is stored in the RAM 418 associated with the CPU 417 (step 7). Then, the halogen lamp 205 is turned on with the light intensity adjusted in the steps 5 and 6, the image data derived by reading the standard white plate 5102 is read into the R, G and B line memories 4003, and the voltage control circuit 4103 is controlled and the amplification factor of the variable gain amplifier 4103 is adjusted for each of R, G and B such that the peak of the image data is between E0H and F8H for each of R, G and B (steps 8 and 9), and they are stored in the RAM 418 associated with the CPU 417 as an indicator for using the halogen lamp 205 (hereinafter an H-indicator) (step 10).

The clamp circuit of the analog signal processing unit which processes the read signal from the IR sensor 210-1, the adjustment of the variable gain amplifier and the storage of the control value are now explained. The halogen lamp 205 is turned off to read the standard white plate 5102 and the reflection mirror 206 is moved under the standard white plate 5102 (step 11). The image data in the absence of the light to the CCD 210 is read into the line memory for the IR signal, the read data is processed by the CPU 417 to control the voltage control circuit 4103 for the IR such that the mean value of one line of image data approaches 08H, the reference voltage of the clamp circuit 4102 is adjusted (steps 12 and 13), and the control value after the adjustment is stored in the RAM 418 associated with the CPU 417 (step 14). Then, the halogen lamp 205 is turned on with the light intensity adjusted in the steps 5 and 6, the infrared fluorescent image data derived by reading the standard white plate 5102 is read into the line memory for IR, the voltage control circuit 4103 for the IR signal is controlled such that the peak of one line of image data of the IR signal is between E0H and F8H, the amplification factor of the variable gain amplifier 4103 is adjusted for each of R, G and B (steps 15 and 16), they are stored in the RAM 418 associated with the CPU 417 as a gain indicator for the IR signal, and the halogen lamp is turned off (step 17).

The control data derived in the adjustment mode are set to the respective control units at the time of power-on.

An ordinary reproduction operation and an associated fluorescent mark discrimination operation are now explained.

As an operator places a document sheet on the platen glass 203 and starts the reproduction operation by a console unit, not shown, the CPU 417 controls a motor, not shown, to move the reflection mirror 206 under the standard white plate 5102.

Then, the halogen lamp 5101 is turned on to illuminate the standard white plate 510 and the shading correction for the R, G and B signals is conducted in the shading correction unit 4002.

Then, the CPU turns on the halogen lamp 5101 to illuminate the standard white plate 5102 and the shading correction for the IR signal is conducted by using the infrared fluorescent light in the shading correction unit 4002.

Then, the document sheet is read four times in synchronism with the image recording operation of the four colors M, C, Y and Bk by the printer unit to attain frame-sequential image recording, and the fluorescent mark is detected in parallel with the read operation and the record operation is controlled in accordance with the detected result.

In the present embodiment, the reproduction is made by four times of read (scan) operations. Operations of the image scanner 201 and the printer 202 in each scan are shown in FIG. 3.

When the forgery of the reproduction inhibited document sheet is to be prevented, the image scanner detects a coarse position of the fluorescent mark in a mode 1 in the first scan and the printer outputs magenta.

In a second scan, the image scanner is in a mode 2 in which the fluorescent mark is extracted from the position of the fluorescent mark detected in the first scan and stores it in the memory to determine if it is the reproduction inhibition mark. The printer output cyan.

In third and fourth scans, the image scanner is in a mode 3 in which a specific measure to prevent the forgery if the forgery is contemplated in the second scan is taken. For example, blanket yellow or black painting (which will be explained later), yellow and black images are not formed or the power of the fixing unit is turned off.

Figure 5:
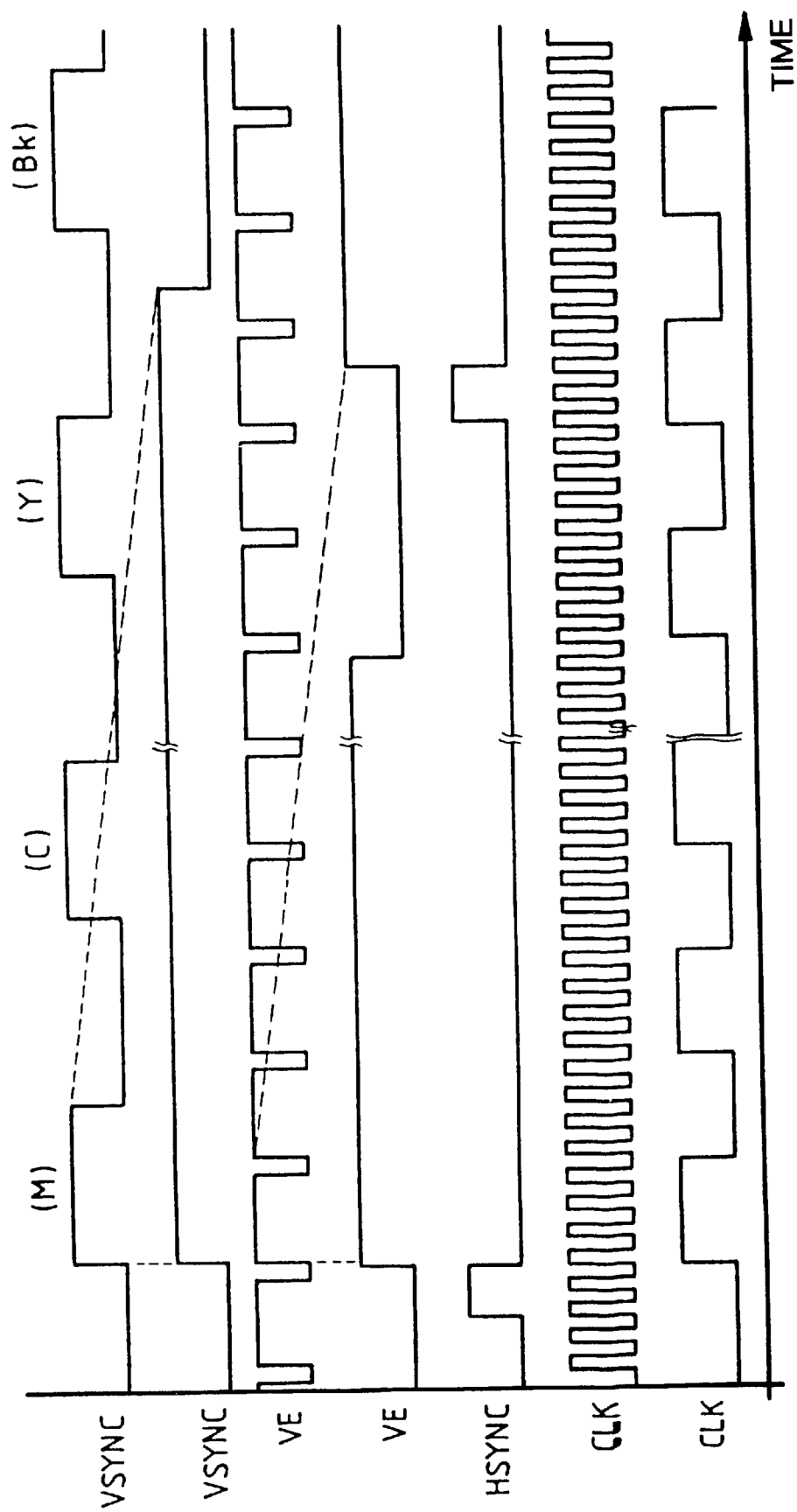
FIG. 5 shows a timing chart of an image control signal in first to third embodiments.

FIG. 5 shows an operation timing in the image scanner of the embodiment.

A VSYNC signal is an image effective section signal in the sub-scan direction. In the "1" section, it sequentially forms output signals (M), (C), (Y) and (Bk) for reading (scanning) the image. VE denotes an image effective section signal in the main scan direction. In the "1" section, the main scan start position is timed. A CLK signal is a pixel synchronization signal for transferring the image data at the rise timing of 0→30 1. A CLK8 is a timing signal of every eighth pixel which times an 8×8 block processed signal to be described later at the rise timing of 0→1.

Image Scanner Unit

The detection of the fluorescent mark of the internal block of the image scanner of FIGS. 4A and 4B and the portion for generating the printer record image are explained below. Numerals 403, 404 and 405 denote logarithmic converters which comprise look-up table ROM's which convert the R, G and B brightness signals to the C, M and Y density signals. Numeral 406 denotes a known masking and UCR circuit. While a detailed description thereof is omitted, the Y, M, C and Bk signals are sequentially outputted with a predetermined length of bits, for example, 8 bits, for each read operation by the input three principal color signals. Numeral 407 denotes an OR gate which logically ORs with the content of the register 408. The register 408 usually stores 00H and the output of 406 is outputted to the printer as it is, but in the forgery inhibition process, the CPU 417 sets FFH in the register 408 through a data bus so that a yellow or black blanket image is outputted.

Numeral 417 denotes a CPU which controls the apparatus in the respective modes. Numeral 4009 denotes a binarization circuit which binarizes the infrared fluorescent light signal at an appropriate slice level. The "1" output of the binarization circuit represents the presence of the fluorescent mark, and the output "0" represents the absence of the fluorescent mark.

The blocking circuit 409 conducts the 8×8 blocking to process the output of the binarization circuit 409 for each 8×8 block.

Numeral 412 denotes a readable and writable random access memory (RAM) and an address is switched by a selector having data thereof switched by a selector 411.

On the other hand, numeral 419 denotes a main scan counter which is reset by a HSYNC signal and counted up at the timing of the CLK signal to generate a 13-bit main scan address (hereinafter X address) X12-X0.

Numeral 420 denotes a sub-scan address counter which is reset by the "0" section of the VSYNC signal and counted up at the timing of the HSYNC signal to generate a 13-bit sub-scan address (Y address) Y12-Y0.

The CPU 417 controls the selectors 411, 413, 415 and 416 and the address decoder 414 in accordance with the mode to read and write data from and to the RAM 412. Numeral 418 denotes a RAM/ROM added to the CPU 417. Numeral 410 denotes a fluorescent mark detection circuit for detecting the position of the fluorescent mark.

Figure 6:
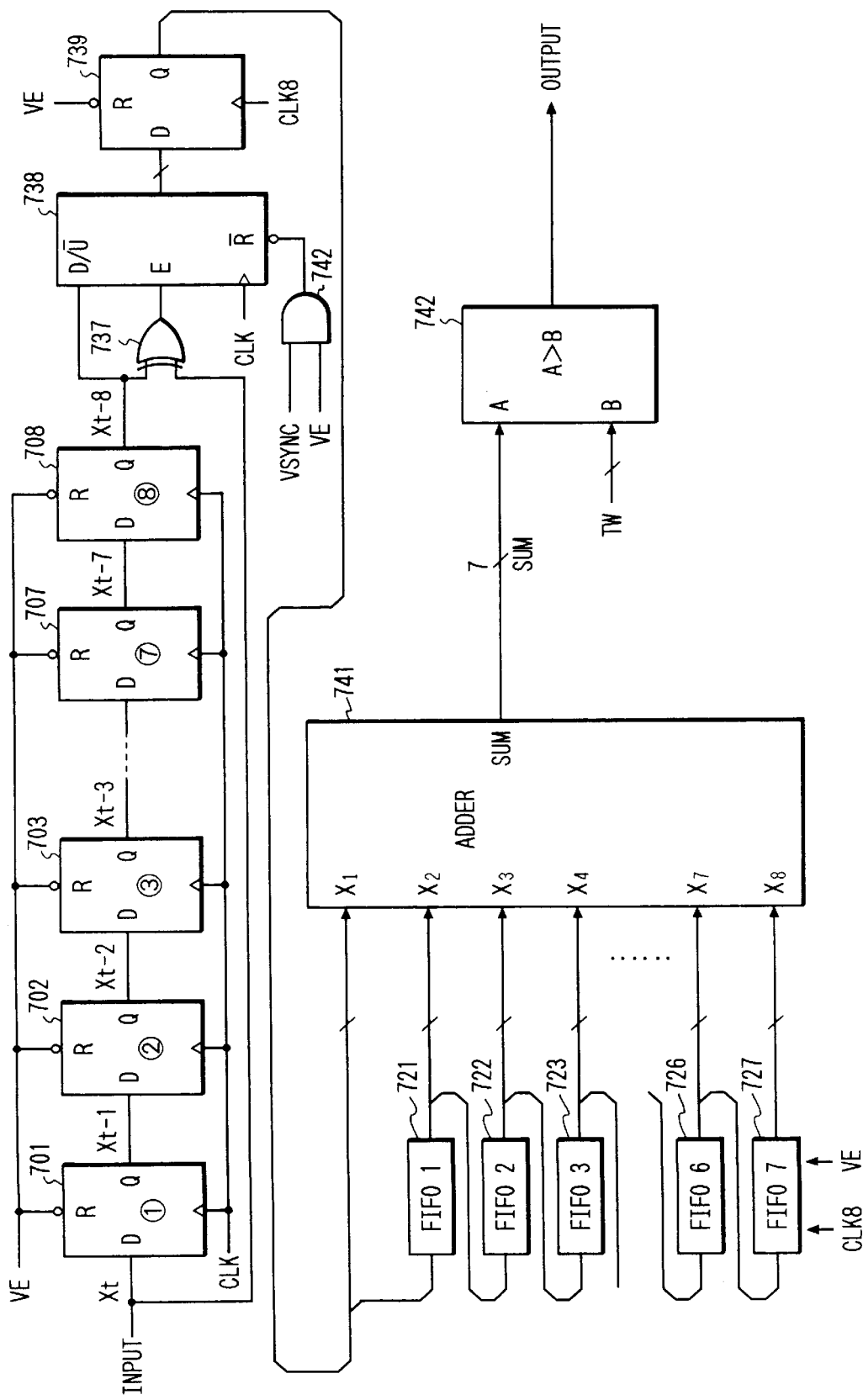
FIG. 6 shows a block diagram of noise elimination of a fluorescent signal in the first embodiment.

FIG. 6 shows a detail of the blocking circuit 409 shown in FIGS. 4A and 4B.

Numerals 701, 702, 703, . . . , 707 and 708 denote seven serially connected D flip-flops (Hereinafter DFF's) which sequentially delay the input signal by the pixel clock CLK and are cleared to "0" by VE="0", that is, in the non-image section.

Numeral 738 denotes an up/down counter, numeral 737 denotes an EX-OR gate and numeral 740 denotes an AND gate. The operation is shown in the table below.

| VSYNC | VE | $X_t$ | $X_{t-8}$ | Counter Output |
|---|---|---|---|---|
| 0 | X | X | X | 0 (clear) |
| X | 0 | X | X | 0 (clear) |
| 1 | 1 | 0 | 0 | Hold |
| 1 | 1 | 0 | 1 | Count down |
| 1 | 1 | 1 | 0 | Count up |
| 1 | 1 | 1 | 1 | Hold |

The output of the counter 738 is cleared to "0" by VSYNC or when VE is in the "0" section, it is held when $X_t=X_{t-8}$, it is counted up when $X_t=1$ and $X_{t-8}=0$, and it is counted down when $X_t=0$ and $X_{t-8}=1$. The counter output is latched by a latch 739 by CLK8 of an 8-clock period so that a sum of the eight input data (the number of "1"s) inputted during one period of CLK8.

Eight lines of data are simultaneously applied to an adder 741 by FIFO memories 721, 722, 723, . . . , 726 and 728 provided one for each line and a sum thereof is outputted. As a result, a sum of the numbers of "1"s in the 8×8 window is outputted.

Numeral 742 denotes a digital comparator which compares the output SUM of the adder 741 with a reference TW preset by the CPU 417 and a result thereof is outputted as "0" or "1".

By presetting an appropriate value as TW, the noise can be eliminated for 8×8 block.

FIGS. 7A and 7B show a fluorescent mark detection circuit 410.

Numeral 827 denotes a line thinning circuit to which the VE signal is applied at every eighth line. Since the writing of the FIFO memories is controlled by the VE signal which is reduced by a factor of 8, the content of the FIFO memories is updated at every eighth line. Since the F/F's are operated by the CLK8, the circuit operates at 8 pixels/8 lines.

Numerals 828, 829 and 830 denote FIFO's each of which provides one line of delay. Four lines are simultaneously processed.

Numerals 831, 832, 833, . . . , 839, 840 and 841 denote DFF's. Three DFF's are arranged in series for four lines of output. All DFF's are driven by the CLK8. If there is at least one "1" (the presence of the fluorescent mark) in the 4×4 area as detected by the OR gate 857, the entire 4×4 area (2 mm×2 mm size on the document sheet) is rendered all "1". Thus, the gap area of the mark is filled as the fluorescent mark area.

Numerals 842, 843 and 844 denote FIFO's each of which provides one line of delay. Four lines are simultaneously processed.

Numerals 845, 846, 847, . . . , 854, 855 and 856 denote DFF'S. Three DFF's are arranged in series for four lines of output. All DFF's are driven by the CLK8. The AND gate 858 outputs an "1" output which indicates that the entire 4×4 area is "1" (the presence of the fluorescent mark). Thus, the area outside of the mark, which was expanded as the fluorescent mark area when the gap of the mark was filled, is returned to the original size. In this manner, the expansion of the noise component of the fluorescent signal by the contamination of the document sheet is suppressed.

Numerals 819, 820, . . . , 821 denote 18 FIFO's each of which provides one line of delay. 19 lines are simultaneously processed.

Numerals 801, 802, 803, . . . , 804, 805, 806, 807, . . . , 808, . . . , 809, 810, 811, . . . , 812, . . . , 813, 814, 815, . . . , 816 denote DFF's. Ten DFF's are arranged in series for 19 lines of output. Numerals 817 and 818 denote nine DFF's arranged in series succeedingly to the DFF 812. All DFF's are driven by the CLK8. When all outputs of the DFF's 804, 808, . . . , 812, 816 (vertical 19 blocks) and DFF's 809, 810, 811, 812, 817, 818 (horizontal 19 blocks) are "1", a "1" output is outputted through AND gates 823, 824 and 825.

One block consists of 8 pixels/8 lines which corresponds to approximately 0.5 mm square on the document sheet. When the fluorescent mark continues 9.5 mm vertically and horizontally, an essentially center position of the mark is latched in the latch 826 and it is sent to the CPU. The 9.5 mm size may be set slightly smaller than the size of the mark in the reproduction inhibited document sheet so that the position of the mark is exactly detected while the effect of the noise component is eliminated.

Figure 8:
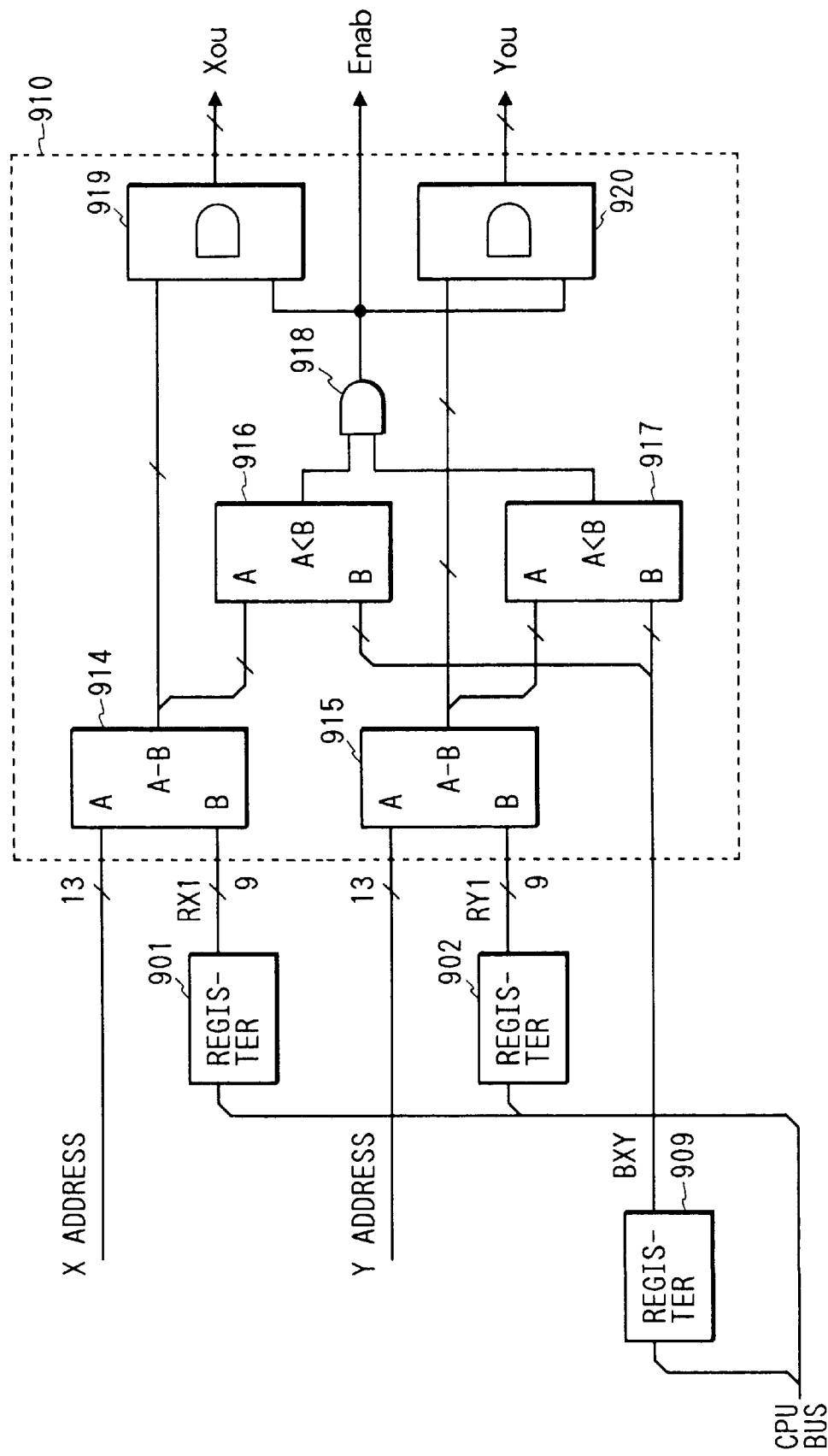
FIG. 8 shows an address generation unit to a memory for storing the fluorescent mark in the first embodiment.

FIG. 8 shows a block diagram of the address decoder 414.

Numeral 901, 902 and 909 denote registers directly connected to a data bus of the CPU and desired values are written therein by the CPU.

Numerals 914 and 915 denote subtractors each of which outputs A–B for inputs A and B. An MSB of the output is a sign bit which is "1" when the output is negative. Numerals 916 and 917 denote comparators each of which outputs "1" when the input A is smaller than the input B (A<B). When the MSB of the input A is"1", it outputs "0" without regard to the input B.

Numerals 918, 919 and 920 denote AND gates. When a value BXY is stored in the register 909, and when $$RX_1 < X \text{ address} < RX_1 + BXY \text{ and } RY_1 < Y \text{ address} < RY_1 + BXY \quad (1)$$

are met, the following is outputted:

Xou=X address-$RX_1$

You=Y address-$RY_1$

Enab=1

Namely, an area of the six BXY having start addresses of $RX_1$ and $RY_1$ is addressed for the main scan and the sub-scan.

Flow of Process

FIG. 3 shows four scans from the first scan to the fourth scan in the present apparatus, the three modes from the mode 1 to the mode 3 in the image scanner and the content of output of the printer.

Figure 9:
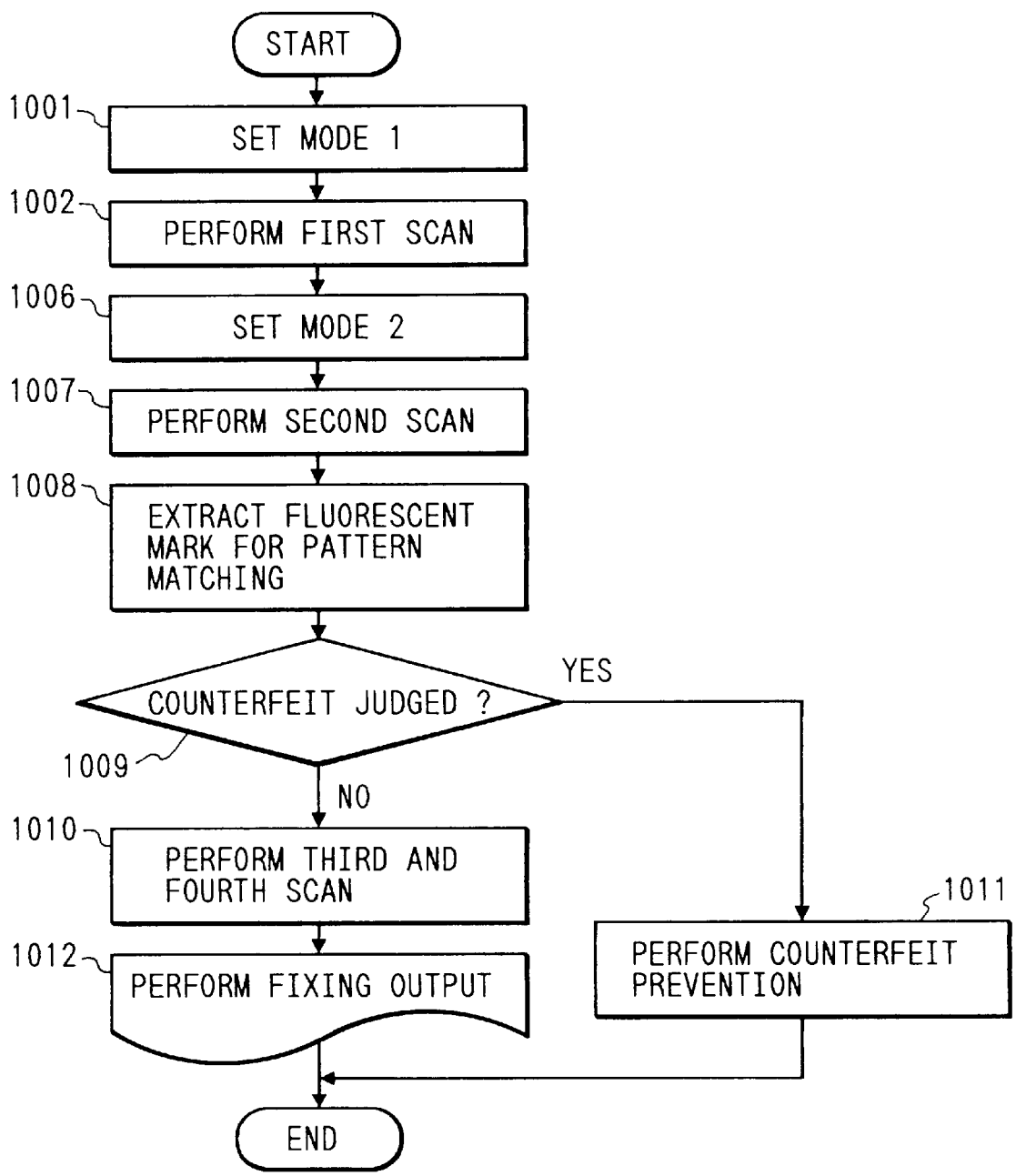
FIG. 9 shows a control flow chart of a CPU in the first embodiment.

FIG. 9 shows a process flow of the CPU control. In FIG. 9, the mode 1 for the first scan is set to the CPU in a step 1001.

In a step 1002, the first scan is started. In the mode 1, the printer outputs in magenta and detects a coarse center position of the fluorescent mark area in the reproduction inhibited document sheet.

In FIG. 1, the reproduction inhibited document sheet corresponding to a ten thousand yen bill is placed on the platen. In the first scan or the mode 1, an address corresponding to (Xc, Yc) is latched to the latch 826 at a center of the hatched fluorescent mark area, that is, in the area corresponding to (Xc, Yc) in FIG. 1, and it is sent to the CPU.

The CPU can roughly determine (Xc, Yc) which is the center of the fluorescent mark.

In a step 1006, the mode 2 is set for the second scan. Namely, the selector 411 is set to B, the selector 413 is set to A and the selectors 415 and 416 are set to B.

The address decoder 414 is set such that the position of the fluorescent mark is at:

$$RX_1 = X_{S1} \quad RY_1 = Y_{S1}$$

(for each pixel)

where X and YC are data of the center position of the mark in the 9.5 mm square detection area as described above.

Since it fully covers the fluorescent mark area having a diameter of 10 mm–20 mm, the number of pixels corresponding to approximately 30 mm (472 at 400 dpi) is set to the BXY.

Values which are offset by 15 mm (236 pixels at 400 dpi) toward an origin point, respectively, are set as the starting addresses $X_{S1}$ and $Y_{S1}$.

In a step 1007, the second scan is conducted and binarized fluorescent signal from a broken line area including the fluorescent mark of FIG. 1 is written.

In a step 1008, the fluorescent mark is discriminated by an algorithm to be described later. In a step 1009, a determination is made, and if a possibility of forgery is null, that is, if the fluorescent mark is not detected, the third scan and the fourth scan are conducted in a step 1010 and the image is developed by four color toners Y, M, C and Bk in a normal operation, and it is fixed in a step 1012.

On the other hand, if the possibility of forgery is present in the step 1009, that is, when the fluorescent mark is detected, the measure to inhibit the forgery is taken in a step 1011. Specifically, the CPU sets FFH to the register 408 of FIG. 4B (which normally stores 00H) so that FFH is sent to the printer and the Y and Bk toners are deposited on the entire surface to prevent normal reproduction.

Pattern Matching

The pattern matching of the fluorescent mark in the step 1008 is explained in detail. Where the fluorescent mark is applied to a bill, the marks may be different between a front surface and a back surface. Accordingly, two fluorescent mark patterns are registered for the pattern matching in order to determine one type of reproduction inhibited document sheet.

Figure 10:
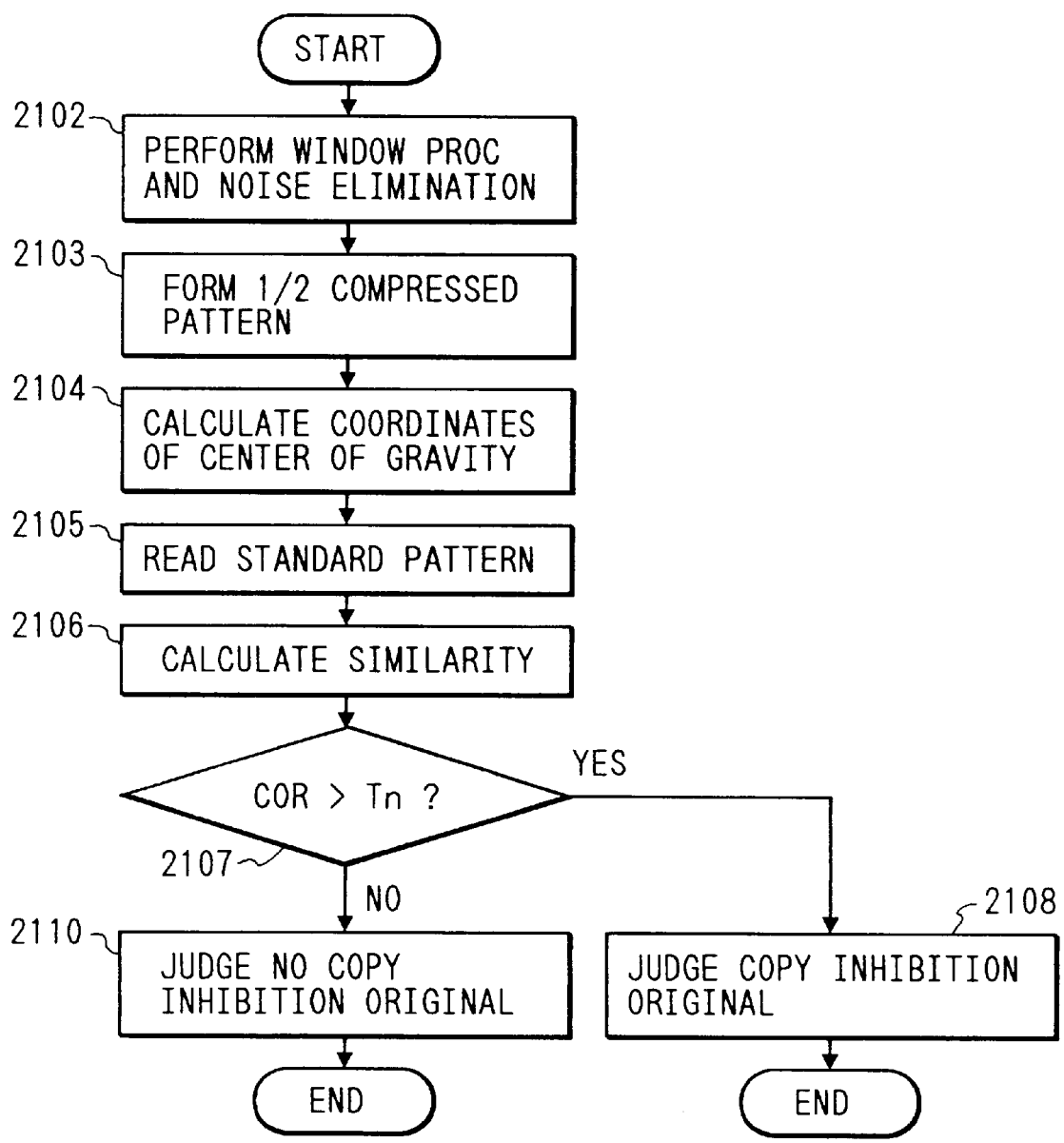
FIG. 10 shows an operation flow chart of pattern matching of the CPU in the first embodiment.

When a specific area of a specified document sheet is written into the RAM 412, the CPU 417 refers the content of the RAM 412 to match the patterns. A flow chart of the pattern matching is shown in FIG. 10. Binarized data of the specified area is stored in the RAM 412.

To this area, a process of steps 2102 et seq is executed. In a step 2102, a window process for eliminating noise is conducted.

It is assumed that the binary image of the area 1 is that shown by 2201 in FIG. 11 in which a small square represents one pixel, a blank pixel represents a white pixel, and a hatched pixel represents a black pixel. They are scanned by a 2×2 pixel window 2202 and the number of black pixels in the window is counted, and if the count exceeds 2, a new black pixel is defined. In this manner, the process result is reduced by a factor of 2 vertically and horizontally as shown by 2203 and a noise reduced pattern is produced. Since the number of black pixel is 1 at 2202, it is defined as a white pixel at 2204.

Then, a center of gravity 1 of the pattern 2203 is calculated.

This is done by a known method by vertically and horizontally projecting the pattern 2203.

Then, a similarity measure is calculated by a standard pattern matching. In a step 2105, a standard pattern registered as a dictionary is read from the ROM 418 of FIG. 4B into the CPU. The standard pattern is the fluorescent pattern of the reproduction inhibited document sheet under consideration. The pattern extracted before the step 2103 may have been rotated depending on the angle of the document sheet mounted on the platen, and when it is compared with a single standard pattern, a satisfactory result may not be attained.

Figure 12A:
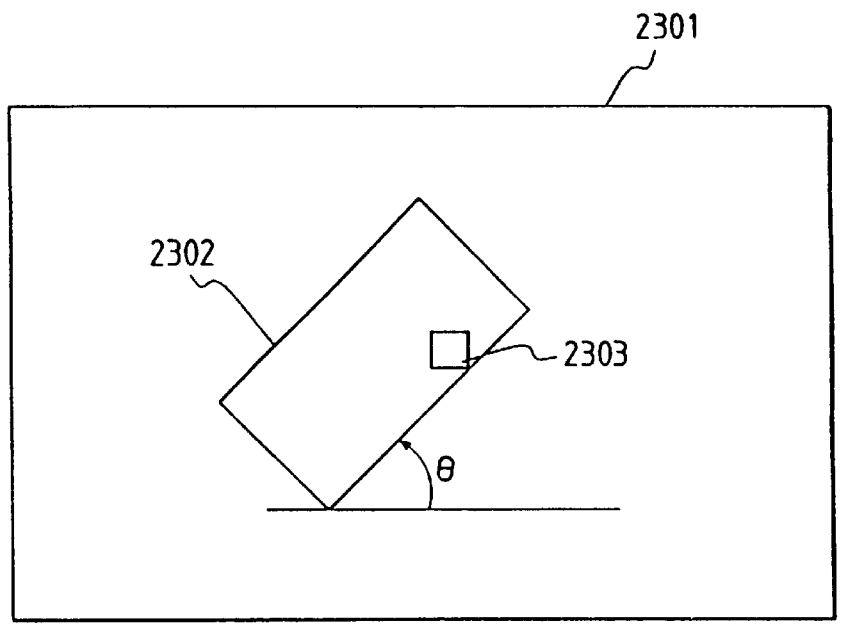
FIGS. 12A to 12C show pattern matching of the fluorescent mark in the first embodiment.
Figure 12B:
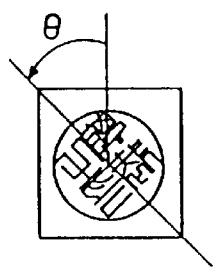
Figure 12C:

This is illustrated in FIGS. 12A to 12C. A plurality of patterns derived by rotating the fluorescent pattern at a pitch of several degrees are stored in the ROM as the standard pattern and an appropriate one of them is selected and read into the CPU. For example, 24 patterns derived by rotating the mark at a pitch of 15 degrees from 0 degree to 360 degrees are used as the standard pattern. In the similarity calculation, the following method may be used although various other methods may be used. As shown in FIGS. 12A to 12C, the extracted pattern is shown by FIG. 12A and the standard pattern of the predetermined rotation angle selected from the 15 degrees pitch patterns is shown by FIG. 12B, and they are represented by B(i,j) and P(i,j), which are "1" for the black pixel and "0" for the white pixel. The center of gravity coordinate of the B(i,j) calculated in the step 3104 of FIG. 10 is represented by $(i_{BC}, j_{BC})$, and the center of gravity coordinate of the P(i,j) is represented by $(i_{PC}, j_{PC})$. The similarity COR of them is given by:

$$COR = \sum_i \sum_j P(i - i_{PC}, j - j_{PC}) \oplus B(i - i_{BC}, j - j_{BC}) \qquad (1)$$

where $\oplus$ represents an exclusive OR of P and B and the formula (1) represents a Hamming distance when the centers of gravity of the pattern B(i,j) are matched. The larger the COR is, the larger is the similarity of both coordinates.

In the present embodiment, a formula (2) which is a modification of the formula (1) is used to determine the similarity COR so that the reliability of the similarity is improved and the possibility of misrecognition is minimized.

$$COR = 2 \times \left( \sum_i \sum_j P(i - i_{PC}, j - j_{PC}) \cdot B(i - i_{BC}, j - j_{BC}) \right) - \left( \sum_i \sum_j \overline{P(i - i_{PC}, j - j_{PC})} \cdot B(i - i_{BC}, j - j_{BC}) \right) \qquad (2)$$

where · represents logical AND, and $$\overline{P(i - i_{PC}, j - j_{PC})}$$

represents determination of P. When both P and B are black pixels, COR is incremented by two, when P=0 and B=1, the COR is decremented by one. In this manner, the precision of recognition is significantly improved.

As the similarity is calculated in this manner, the COR is compared with the predetermined Th in a step 2107.

If COR>Th, it means that the fluorescent mark is present and the comparison is terminated with the result of the presence of the reproduction inhibited document sheet (2108).

If COR<Th, it means that the fluorescent mark is not present in the process area and the comparison is terminated with the result of the absence of the reproduction inhibited document sheet (2110).

Second Embodiment

In the present embodiment, the presence of the fluorescent light itself is detected rather than the shape of the pattern represented by the infrared fluorescent light information in the reproduction inhibited document sheet.

In some reproduction inhibited document sheets such as a Canadian bill, a fluorescent characteristic is imparted to the fiber of the sheet of the bill. In the present embodiment, the infrared fluorescent light from fine line information of such fiber is detected to detect the reproduction inhibited document sheet.

Figure 25B:
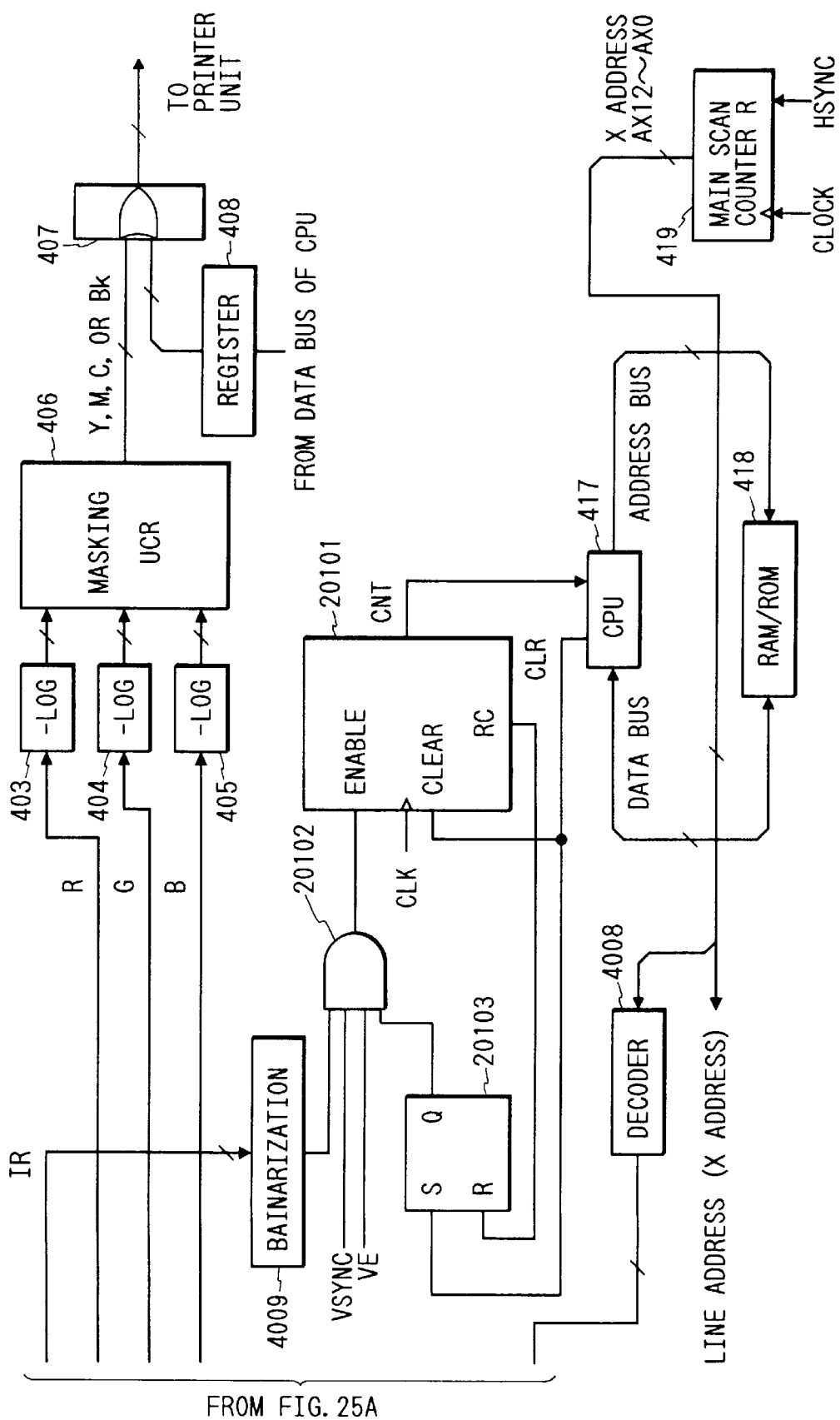
FIG. 25 is comprised of FIGS. 25A and 25B showing the configuration of a signal processing unit of a second embodiment.

A control block diagram of the present embodiment is shown in FIGS. 25A and 25B. In the present embodiment, the number of pixels of the fluorescent light information included in the document sheet is counted rather than the pattern matching of the fluorescent mark.

In FIGS. 25A and 25B, like elements similar to those of FIGS. 4A and 4B are designated by like numerals. Numeral 20101 denotes a counter which counts the number of fluorescent pixels from the document sheet by the CLK. In the present embodiment, an 8-bit counter is used to accumulate up to 255 fluorescent pixels. Numeral 20202 denotes a four-input AND gate which supplies the binarized fluorescent signal outputted from a binarization circuit 4009 when the main scan section signal VE and the sub-scan section signal VSYNC are present as an enable signal of the counter 20101. The counter 20101 is cleared to "0" by the CLR signal from the CPU and the flip-flop (F/F) 20103 is set by the clear signal to validate the output from the gate 20102.

When the binarized signal is applied in excess of the maximum count 255 of the counter 20101, an RC signal is generated when the output of the counter 20101 reaches 255 and the F/F 20103 is reset so that the enable input to the counter is forced to "0" and the counter output is held at 255.

The CPU 4317 reads the count of the counter 20101 as the CNT signal, and when the count is larger than a predetermined value (for example, 128 pixels), it is detected that the reproduction inhibited document sheet is being reproduced.

Figure 26:
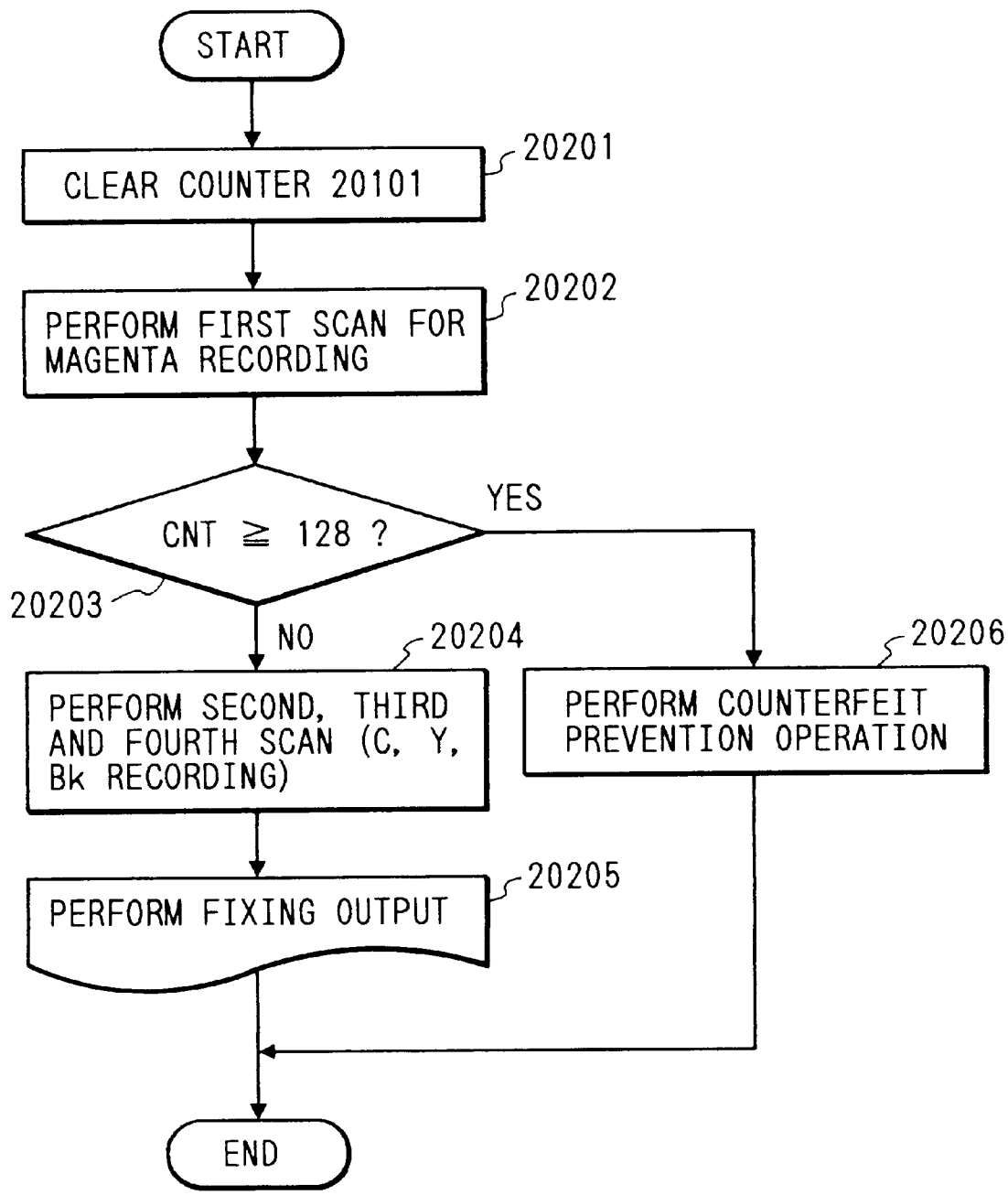
FIG. 26 shows a control flow of a CPU in the second embodiment.

FIG. 26 shows a process flow of the CPU in the present embodiment.

In a step 20201, the CPU clears the counter 20101 and the F/F 20103.

In a step 20202, the first scan is started. The printer outputs is magenta and counts the number of pixels of the fluorescent information from the document sheet.

In a step 20203, whether the number of fluorescent pixels is larger than the predetermined value or not is determined. If the decision in the step 20203 shows that the possibility of forgery is not present, that is, when the number of fluorescent pixels is smaller than the predetermined value, the second, third and fourth scans are conducted in a step 20204 and the image is developed by four toners M, C, Y and Bk in a normal operation and it is fixed in a step 20205.

On the other hand, if the decision in the step 20203 is that the possibility of forgery is present, that is, when the fluorescent pixels which are larger in number than the predetermined value are detected, the measure to prevent the forgery is taken in a step 20206. Specifically, FFH is set to the register 408 of FIGS. 4A and 4B (which normally stores 00H) so that FFH is sent to the printer and the C, Y and Bk toners are deposited to the entire surface to prevent the reproduction.

Third Embodiment

In the present embodiment, the presence of the fluorescent light itself is detected rather than the shape of the infrared fluorescent information in the reproduction inhibited document sheet, as it is in the second embodiment.

In the present embodiment, the presence of the fluorescent mark other than the visible rat, such as the infrared ray, contained in the reproduction inhibited document sheet is detected and the fluorescent information is converted to the visible ray information and it is recorded with the visible ray information from the document sheet. In this manner, the normal reproduction operation of the reproduction inhibited document sheet is prevented.

Figure 27:
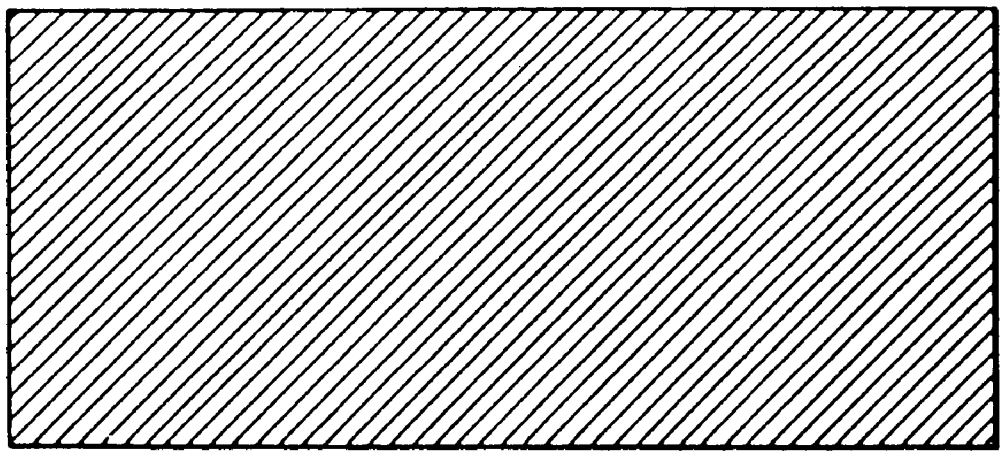
FIG. 27 shows a print status of fluorescent information of a reproduction inhibited document sheet in a third embodiment.

The fluorescent information of the reproduction inhibited document sheet effective in the present embodiment may be a periodic pattern recorded on the entire surface of the document sheet as shown in FIG. 27 or a blanket fluorescent information pattern applied to the enitre surface of the document sheet. In practice, the fluorescent information may be one which exhibits a transparent characteristic to visible light so long as it is used for the normal application other than the unauthorized reproduction.

Figure 28B:
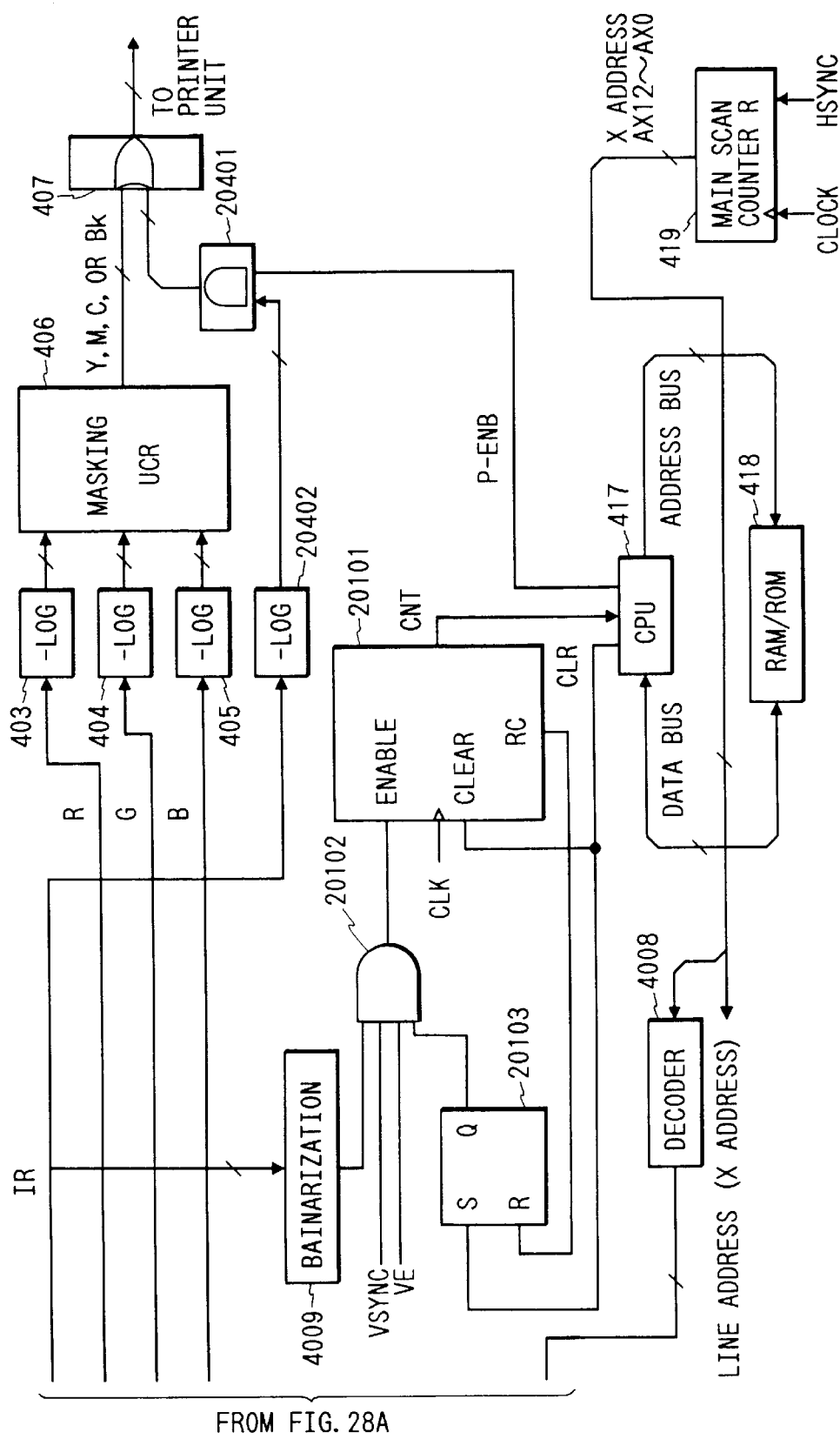
FIG. 28 is comprised of FIGS. 28A and 28B showing the configuration of a signal processing unit in the second embodiment.

A control block diagram in the present embodiment is shown in FIGS. 28A and 28B. Like in FIGS. 25A and 25B, the number of pixels of the fluorescent information contained in the document sheet is counted rather than the pattern matching of the fluorescent mark. In FIGS. 28A and 28B, like elements like those shown in FIGS. 25A and 25B are designated by like numerals.

Numeral 20401 denotes an AND gate. The infrared fluorescent read signal IR is light intensity-density converted, and the output thereof is enabled by a P-ENB signal from the CPU 417, and it is combined with a normal visible record image by the OR gate 407. The IR signal has a CCD read phase shift relative to the visible information in the sub-scan direction corrected by delay means 401. Where a moare fringing is generated by the fluorescent information and the visible information when the fluorescent information is printed on the reproduction inhibited document sheet, the intended effect of the prevention of reproduction by the moare can be effectively utilized.

The CPU 417 reads the count of the counter 20101 as the CNT signal and when the count is larger than a predetermined value (for example 128 pixels), the reproduction of the reproduction inhibited document sheet is detected and the P-ENB signal is set to "1" to visualize the infrared fluorescent information and prevent the normal reproduction operation.

Figure 29:
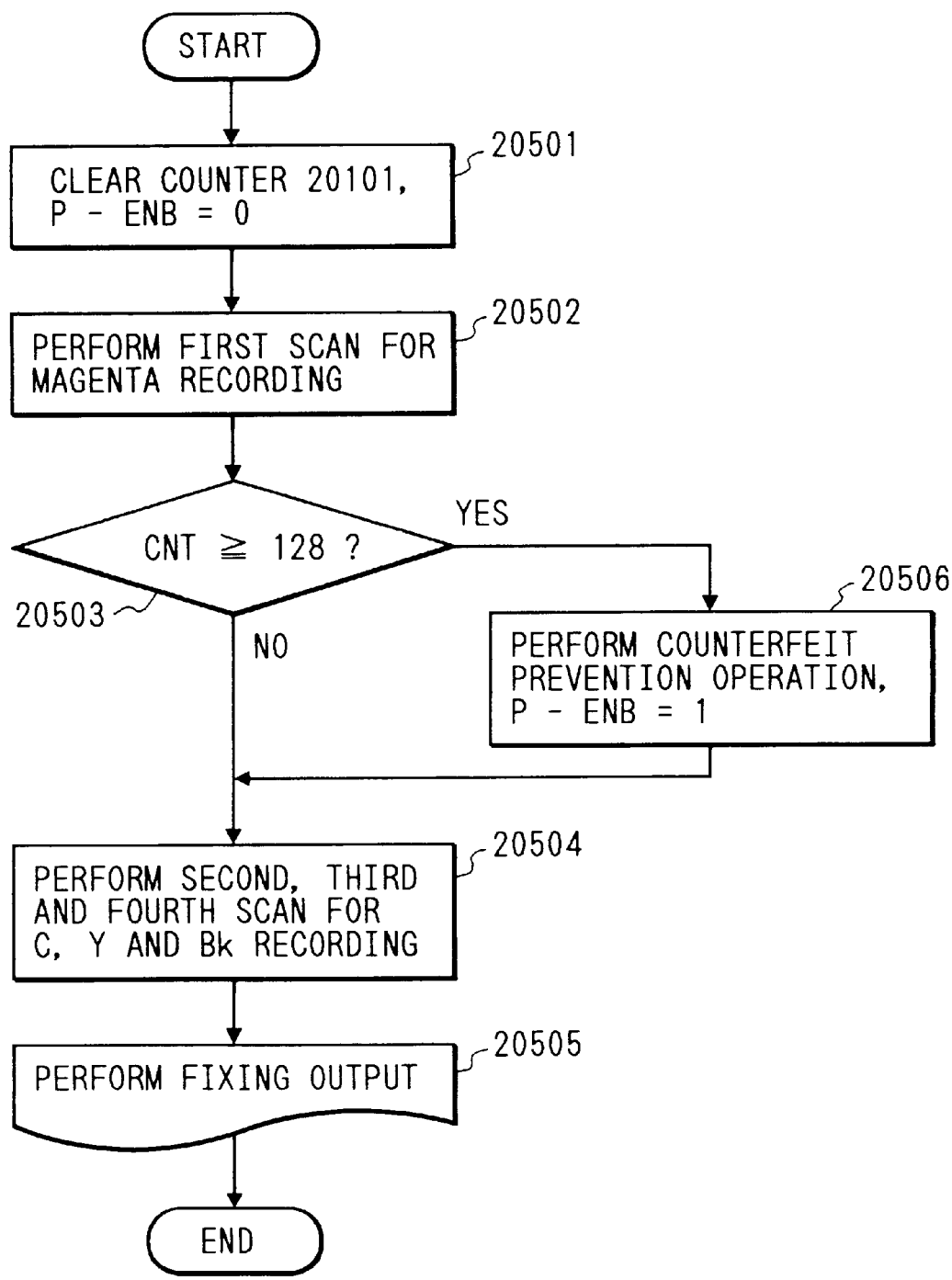
FIG. 29 shows the control flow of the CPU in the second embodiment.

FIG. 29 shows a process flow of the CPU in the present embodiment.

In a step 20501, the CPU clears the counter 20101 and the F/F 20103 and sets the P-ENM signal to "0".

In a step 20502, the first scan is started. The printer outputs in magenta and the number of pixels of the fluorescent information from the document sheet is counted.

In a step 20503, whether the number of fluorescent pixels is larger than the predetermined value (128) or not is determined. If the decision in the step 20503 is that the possibility of forgery is not present, that is, when the number of fluorescent pixels is smaller than the predetermined value, the second scan, third scan and fourth scan are conducted in a step 20504 and the image is developed by four color toners M, C, Y and Bk in the normal process and it is fixed in a process 20505.

On the other hand, if the decision is that the number of fluorescent pixels is larger than the predetermined value and the possibility of forgery is present, a measure to prevent the forgery is taken in a step 20506. Specifically, the P-ENB signal is set to "1" and the record image having the fluorescent information combined as the visible information at the time of recording C, Y and Bk is sent to the printer. As a result, the normal reproduction operation is disabled.

Other Embodiments

In the previous embodiment, the excitation light is the infrared ray component near approximately 700 nm, and the infrared fluorescent light having a peak at approximately 800 nm is emitted from the identification mark. Alternatively, the excitation light may be a light in a visible range and fluorescent ink which emits an infrared fluorescent light of 700–800 nm may be used to construct the information for indicating the reproduction inhibited document sheet.

In the previous embodiment, the infrared block filters of FIG. 20 are provided as the CCD filters for reading R, G and B, but in the above case, a filter having a characteristic of FIG. 20 which blocks the wavelength of 650 nm or higher is used as the filter 208 for blocking the infrared ray at the light source.

As a result, the lights applied to the R, G and B line sensors are only the infrared ray from the identification mark of the reproduction inhibited document sheet or the infrared ray emitted in a special case, and it is not necessary for the CCD's for reading R, G and B to have the characteristic to block the infrared ray including the near infrared ray of 650 nm or higher and the cost reduction of the CCD is attained.

An ultraviolet ray may be used as the excitation light and the information indicating the reproduction inhibited document sheet may be constructed by the fluorescent ink which emits the infrared ray of 700–800 nm.

Figure 30:
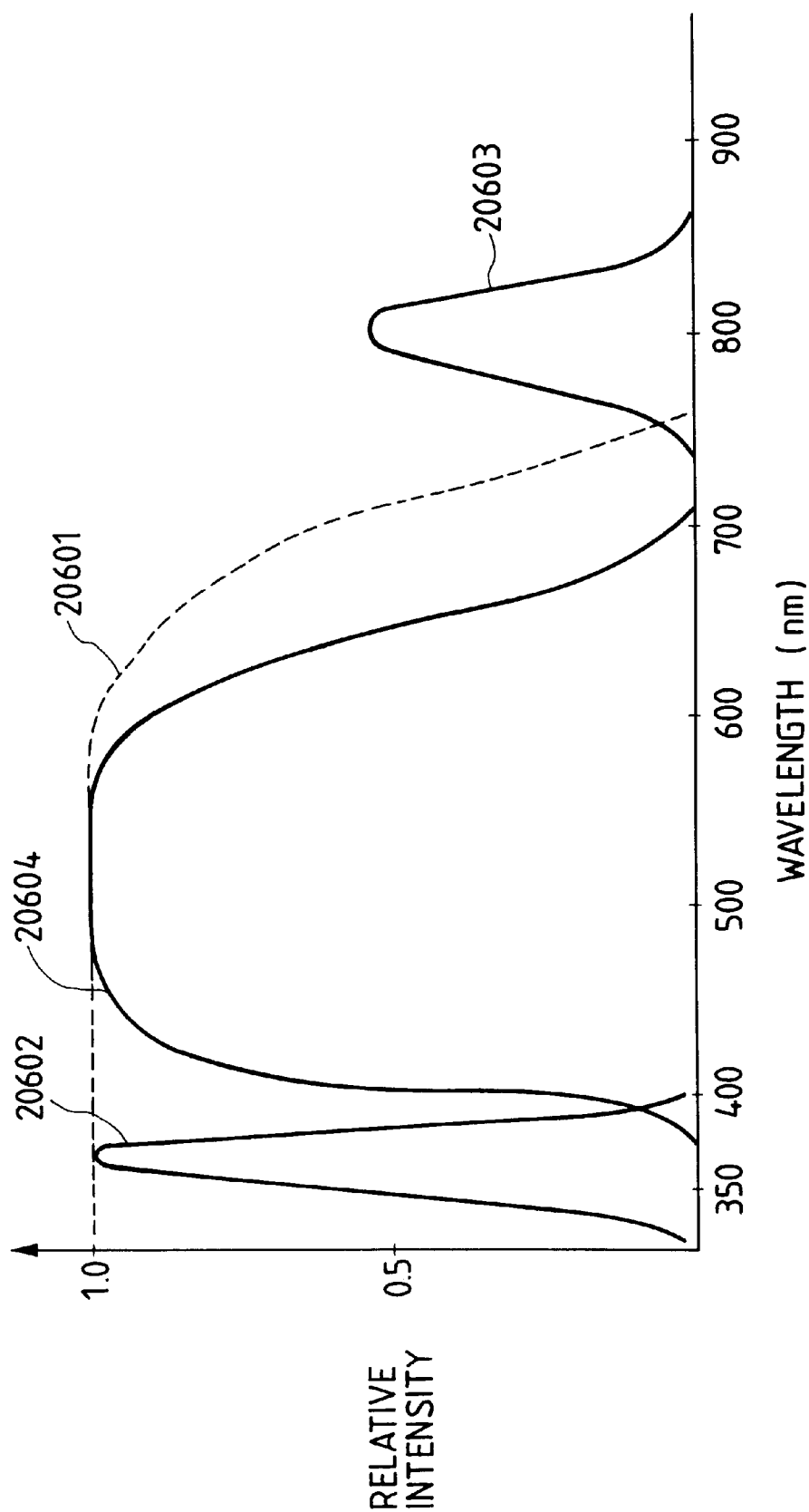
FIG. 30 shows a characteristic of an infrared fluorescent light by an ultraviolet excited light.

In this case, a metal halide lamp having a light emission component in the ultraviolet area may be used as the light source for the first embodiment, and a filter having the characteristic of FIG. 20 which blocks 650 nm or higher may be used as the filter 208 for blocking the infrared ray at the light source to prevent the direct reflected light of the infrared ray from the light source from being applied to the R, G, B and IR sensors. The spectroscopic characteristic of the document sheet illumination sheet in this case is shown by 20601 in FIG. 30. As the filters for the R, G and B CCD's, filters which have the R, G and B spectroscopic characteristics of FIG. 19 and have the characteristic of 20604 of FIG. 30, which blocks the ultraviolet ray of 400 ns or lower and the infrared ray of 650 nm or higher, are provided. As a IR sensor, the filter having the characteristic of FIG. 16, which blocks the visible component and the ultraviolet component, is used to read only the ultraviolet fluorescent component. The ultraviolet excitation light 20602 having a larger light energy than the visible ray and the infrared ray is used to attain a higher level of infrared fluorescent light 20603. In this manner, the recognition of the fluorescent mark (identification mark) is assured.

The CCD shown in FIGS. 15A and 15B is not limited to reading the infrared fluorescent light and the visible information but it may be used for reading the visible information and the infrared information as well. In this case, a sensor having a thick photo-sensing layer is provided externally of the visible information reading sensor.

The CCD shown in FIGS. 15A and 15B is not limited for reading the infrared ray other than the visible ray and the visible information, but it may be use to read the ultraviolet information other than the visible ray and the visible information as well. In order to effectively read the ultraviolet information having a short wavelength, it is necessary in the sectional structure of the sensor shown in FIGS. 7A and 7B to make thin the thickness of a photoelectric conversion layer formed by a p-layer which contributes to the photoelectric conversion and an upper n-layer. To this end, it is necessary to physically isolate the photo-diode and the serial charge transfer unit which is usually formed on the opposite sides thereof to suppress the electrical induction. To this end, the spacing between the ultraviolet read sensor and other line sensors is made larger than that of the other line sensors. Further, the sensor having a different structure of photo-sensing layer is arranged externally of the other sensor to simplify the construction of the CCD.

The CCD shown in FIGS. 15A and 15B is not limited to the reading of the infrared fluorescent light and the visible information but it may be used to read the visible information and the ultraviolet, visible and infrared fluorescent information as well. In order to read well fluorescent information, the fluorescent reading sensor may be provided externally of the plurality of line sensors or the line-to-line spacing may be made larger than that of the other sensors to suppress the cross-talk from the information other than the fluorescent information. The infrared ray sensor is provided externally of the visible information reading sensor.

In the above embodiments, the common illumination system is used for reading the visible information and exciting the fluorescent light although illumination lamps having different characteristics may be used in combination. For example, an FL lamp for the visible ray and a halogen lamp for exciting the infrared ray, or a halogen lamp for reading the visible ray and an FL lamp (black lamp) for generating only the ultraviolet excitation light may be combined.

In the above embodiments, the standard white plate is used to correct the visible ray read data and the infrared ray fluorescent data. Alternatively, the standard white plate for correcting the visible ray and the reference plate for correcting the infrared fluorescent light may be separately provided at different areas.

As the common reference plate, a white reference plate for the visible ray, which is coated with an infrared fluorescent material which is substantially transparent to the visible ray, may be used.

In accordance with the embodiments of the present invention, the specified document sheet is detected by using the fluorescent information which exhibits the substantially transparent characteristic to the visible ray so that the reproduction inhibited document sheet, is detected without affecting the use status of the visible ray.

Further, since the document sheet information is discriminated by using the information other than the visible ray, the discrimination information contained in the document sheet cannot be visually discriminated and it cannot be discriminated by an ordinary image reading means. Accordingly, the confidentiality of the reproduction inhibit function to the reproduction inhibited document sheet is secured. In addition, since the specified document sheet is identified by using the information other than the visible information, it is possible to intentionally reduce the information which is confusing to the identification information than when the visible information is used, and more precise recognition of the specified document sheet is attained.

By recording the information not discriminated by the visible ray as the visible information, it is possible to readily discriminate unauthorized reproduction from the reproduction inhibited document sheet.

Since the visual information and the information other than the visual information are simultaneously read and the document sheet is discriminated by using the information other than the visible information, it is possible to improve the precision of discrimination of the document sheet than when the visible information is used while the document sheet is discriminated on real time for the output operation of the image data. Thus, the inhibition of the reproduction to the reproduction inhibited document sheet is more effectively attained.

The information other than the visible information of the reproduction inhibited document sheet may be converted to the visible information on real time and may be outputted in combination with the visible information from the document sheet so that the output of the complete visible data from the reproduction inhibited document sheet is prevented by the simple control.

The illumination for the visible information is shared by the illumination for reading the information and the separation of the visible information from the information other than the visible information is done by independent sensors. Accordingly, the intensities of the illumination light for the visible information and the invisible information are enhanced by the simple construction. Further, since the sensors are independently provided for the visible and invisible information, gains for the read signals may be optimally set. As a result, the S/N ratio for the visible and invisible information can be optimized and high grade document sheet reading and high precision document sheet discrimination are compatible with a simple construction.

By providing the filter which passes the excitation wavelength component of the fluorescent component and attenuates the fluorescent waveform component in the optical path from the document sheet illumination lamp to the document sheet, the reading of the fluorescent information with a high S/N ratio is attained.

By providing the filter which blocks the wavelength other than the visible wavelength behind the optical system common to the visible ray and the invisible ray and in front of the sensor for reading the visible ray, the reading of the visible information without being affected by the invisible ray is attained.

By providing the filter which blocks the excitation light to the fluorescent light or the visible ray behind the optical system common to the visible ray and the invisible ray and in front of the sensor for reading the invisible ray, the reading of the invisible ray with a high S/N ratio is attained.

By using the fluorescent information generated by the illumination including a large amount of infrared ray such as a halogen lamp used in the prior art, the reproduction inhibit information can be positively detected.

By monolithically constructing the sensor for detecting the invisible information with the sensor for reading the visible information, it is not necessary to secure an optical path by using a special optical system such as a prism for reading the invisible information and the precise reading of the invisible information at the same document sheet position is attained with a simple construction of the optical system and the forgery by the combination of the identification mark and the document sheet information can be precisely prevented.

By selecting the thickness of the photo-sensing layer of the sensor for reading the information other than the red visible information constructed monolithically with the visible information sensor to be different from that of the visible information sensor, the reading of the visible information and the reading of the invisible information are attained on one chip. By making wider the line spacing between the sensor for reading the invisible information and the other sensors for reading the visible information than that of the other sensors, the compliance to the complexity of the CCD structure for reading the invisible information such as the change of the thickness of the photosensing layer between the visible information and the invisible information may be readily done and the yield of the CCD is improved.

By arranging the sensor for reading the invisible information outermost of the plurality of line sensors, the compliance to the complexity of the CCD structure for reading the invisible information, such as the change of the thickness of the photosensing layer between the visible information and the invisible information, is facilitated and the yield of the CCD is improved.

By constructing the sensor for detecting the fluorescent information monolithically with the sensor for reading the information other than the fluorescent information, it is not necessary to secure an optical path by using a special optical system such as a prism for reading the fluorescent information and the precise reading of the fluorescent information to the same document sheet position is attained with a simple optical system and the combination of the identification mark and the document sheet information can be precisely attained.

By selecting the photo-sensing area of the sensor for reading the fluorescent information larger than that of the sensor for reading visible information, the high grade reading with the same S/N ratio as that for the visible ray is attained for the invisible fine information generated by the fluorescent light.

By arranging the sensor for reading the fluorescent ray outermost of the plurality of line sensors for reading the visible information, the affect of the cross-talk by the visible read signal having a relatively large signal level with respect to the weak fluorescent read signal can be reduced and the high precision reading of the fluorescent information is attained.

By selecting the line spacing between the sensor for reading the fluorescent information and other sensors for reading the visual information to be wider than that of the other line sensors, the affect of the visible read signal having a relatively large signal level relative to the weak fluorescent read signal and the high precision reading the fluorescent information is attained.

By providing standard density means for correcting the scatter of sensitivity by the main scan position due to the scatter of illumination, to the read signal of the sensor for reading the invisible information in common to that for the visible information, the compactness of the apparatus is attained.

By setting the circuit gain for the fluorescent read signal by using the read signal from the reference density plate for correcting the signal of the sensor for reading the fluorescent information and correcting the scatter of sensitivity the fluorescent reading sensor, the dynamic range of the read signal for the invisible information can be optimally set and the reading of the fluorescent information without overflow and with the same S/N ratio as that of for the visible ray is attained.

By setting the circuit gain for the read signal for the invisible information by using the read signal from the reference density plate for correcting the signal of the sensor for reading the invisible information and correcting the scatter of sensitivity of the sensor, the dynamic range of the read signal for the invisible information can be optimally set and the reading of the invisible information without overflow and with the same SIN ratio as that for the visible information is attained.

In accordance with the present invention, the document sheet containing a plurality of information having the waveform characteristics ranging from the visible range to the invisible range can be efficiently read.

The present invention is not limited to the embodiments described above but various modifications thereof may be made without departing from the scope of the claims.

What is claimed is:

1. A photo-sensor apparatus comprising:
   a first plurality of sensing elements for obtaining visible information;
   filter means for cutting off invisible information into said first plurality of sensing elements obtaining the visible information; and
   a second plurality of sensing elements for obtaining the invisible information,
   wherein said first and second plurality of sensing elements are formed in one chip or on the same semiconductor chip, output signal voltage levels of said first plurality of sensing elements and output signal voltage levels of said second plurality of sensing elements are adjusted independently to provide uniform sensitivity, and said adjusting is performed by using reference means, and said reference means is disposed at one predetermined position of said photo-sensor apparatus.

2. A photo-sensor according to claim 1, wherein said invisible information is infrared information.

3. A photo-sensor according to claim 1, wherein said invisible information is fluorescence-based information.

4. A photo-sensor according to claim 1, wherein said photo-sensor is used for an image reading apparatus.

5. A photo-sensor according to claim 1, wherein said photo-sensor is used for an image reproducing apparatus.

6. A photo-sensor comprising:

a first line sensor for obtaining visible information;

filter means for cutting off input of invisible information into said first line sensor;

a second line sensor for obtaining the invisible information; and signal generation means for supplying a read-out signal to said photo-sensor consisting of said first line sensor and said second line sensor, to read out signal information from said photo-sensor wherein said first and second line sensors are arranged in parallel with each other and each sensor comprises a plurality of sensing elements, and wherein said first line sensor and said second line sensor respectively output an image signal according to the visible information and an image signal according to the invisible information, in parallel.

7. A photo-sensor according to claim 6, wherein said invisible information is infrared information.

8. A photo-sensor according to claim 6, wherein said invisible information is fluorescence-based information.

9. A photo-sensor according to claim 6, wherein said photo-sensor is used for an image reading apparatus.

10. A photo-sensor according to claim 6, wherein said photo-sensor is used for an image reproducing apparatus.

* * * * *

UNITED STATES PATENT AND TRADEMARK OFFICE
CERTIFICATE OF CORRECTION

PATENT NO.   : 6,051,826
DATED        : April 18, 2000
INVENTOR(S)  : Shinobu Arimoto et al.

It is certified that error appears in the above-identified patent and that said Letters Patent is hereby corrected as shown below:

Item [56] References Cited, Item [56], FOREIGN PATENT DOCUMENTS, "4011281 A1 10/1990 Germany" should be deleted.

Item [57] ABSTRACT,
"other the" should read -- other than the --.

Sheet 29,
Figure 25B, in block 4009 "BAINARIZATION" should read -- BINARIZATION --.

Sheet 33,
Figure 28B, in block 4009 "BAINARIZATION" should read -- BINARIZATION --.

Column 2,
Line 13 and 25, "other" should read -- another --.

Column 3,
Line 14, "other" should read -- another --.
Line 59, "of" should be deleted.

Column 9,
Line 63, "be 255" should read -- equal 255 --.

Column 12,
Line 6, "0→30 1." should read -- 0→1. --.
Line 26, "through.a" should read -- through a --.

Column 13,
Line 54, "an" should read -- a --.

Column 14,
Line 66, "X and YC" should read -- Xc and Yc --.

Column 17,
Line 58, "rat" should read -- ray --.

Column 18,
Line 2, "enitre" should read -- entire --.

UNITED STATES PATENT AND TRADEMARK OFFICE
CERTIFICATE OF CORRECTION

PATENT NO. : 6,051,826
DATED : April 18, 2000
INVENTOR(S) : Shinobu Arimoto et al.

It is certified that error appears in the above-identified patent and that said Letters Patent is hereby corrected as shown below:

Column 19,
Line 44, "for" should read -- to --.
Line 46, "use" should read -- used --.

Column 22,
Line 23, "reading" should read -- reading of --.
Line 26, "of" should be delete.
Line 34, "of sensitivity the" should read -- sensitivity of the --.
Line 46, "SIN" should read -- S/N --.

Signed and Sealed this

Twenty-seventh Day of November, 2001

Attest:

*Attesting Officer*

NICHOLAS P. GODICI
*Acting Director of the United States Patent and Trademark Office*